US008035542B2

(12) United States Patent
Ishikawa

(10) Patent No.: US 8,035,542 B2
(45) Date of Patent: Oct. 11, 2011

(54) DIGITAL-TO-ANALOG CONVERTER AND SUCCESSIVE APPROXIMATION TYPE ANALOG-TO-DIGITAL CONVERTER INCLUDING THE SAME

(75) Inventor: Kiyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/726,072

(22) Filed: Mar. 17, 2010

(65) Prior Publication Data

US 2010/0259432 A1   Oct. 14, 2010

(30) Foreign Application Priority Data

Apr. 9, 2009  (JP) .................................. 2009-094839

(51) Int. Cl.
*H03M 1/66*  (2006.01)
(52) U.S. Cl. ......... 341/144; 341/145; 341/172; 341/150
(58) Field of Classification Search .................. 341/144, 341/145, 172, 150
See application file for complete search history.

(56) References Cited

U.S. PATENT DOCUMENTS

| 7,199,745 | B2 | 4/2007 | Tachibana et al. | |
| 7,439,896 | B2* | 10/2008 | Sutardja | 341/150 |
| 7,453,389 | B1* | 11/2008 | Vu et al. | 341/172 |
| 2007/0052566 | A1* | 3/2007 | Sutardja | 341/144 |

FOREIGN PATENT DOCUMENTS

| JP | 55-165025 A | 12/1980 |
| JP | 2007-49637 A | 2/2007 |

* cited by examiner

*Primary Examiner* — Jean Jeanglaude
(74) *Attorney, Agent, or Firm* — Arent Fox LLP

(57) ABSTRACT

A digital-to-analog converter generates a voltage from power supply and ground voltages, generates upper and lower limit reference voltages for a reference width which regards the generated voltage as an intermediate potential, converts a change in an analog input signal with respect to the upper and lower limit reference voltages into a digital code, and performs a control in order to achieve a sample and hold of the analog input signal.

17 Claims, 20 Drawing Sheets

FIG.13

| REFERENCE LEVEL | SAMPLE STATE | | | | | | HOLD STATE | | | | | |
|---|---|---|---|---|---|---|---|---|---|---|---|---|
| | C11 | C12 | C13 | C21 | C22 | C23 | C11 | C12 | C13 | C21 | C22 | C23 |
| 0 | ANALOG | ANALOG | ANALOG | ANALOG | ANALOG | ANALOG | Vcc | Vcc | Vcc | GND | GND | GND |
| 1 | $Z_H$ | ANALOG | ANALOG | $Z_H$ | ANALOG | ANALOG | $Z_H$ | Vcc | Vcc | $Z_H$ | GND | GND |
| 2 | ANALOG | $Z_H$ | ANALOG | ANALOG | $Z_H$ | ANALOG | Vcc | $Z_H$ | Vcc | GND | $Z_H$ | GND |
| 3 | $Z_H$ | $Z_H$ | ANALOG | $Z_H$ | $Z_H$ | ANALOG | $Z_H$ | $Z_H$ | Vcc | $Z_H$ | $Z_H$ | GND |
| 4 | ANALOG | ANALOG | $Z_H$ | ANALOG | ANALOG | $Z_H$ | Vcc | Vcc | $Z_H$ | GND | GND | $Z_H$ |
| 5 | $Z_H$ | ANALOG | $Z_H$ | $Z_H$ | ANALOG | $Z_H$ | $Z_H$ | Vcc | $Z_H$ | $Z_H$ | GND | $Z_H$ |
| 6 | ANALOG | $Z_H$ | $Z_H$ | ANALOG | $Z_H$ | $Z_H$ | Vcc | $Z_H$ | $Z_H$ | GND | $Z_H$ | $Z_H$ |
| 7 | $Z_H$ | $Z_H$ | $Z_H$ | $Z_H$ | $Z_H$ | $Z_H$ | $Z_H$ | $Z_H$ | $Z_H$ | $Z_H$ | $Z_H$ | $Z_H$ |

FIG.18

| INPUT | | | OUTPUT | |
|---|---|---|---|---|
| Ref | S/H | Vcc OR GND | OUT | |
| L | X | Vcc OR GND | OUT | |
| H | H | X | $Z_H$ | |
| H | L | X | ANALOG INPUT | |
| H | L | H | Vcc | |
| H | L | L | GND | |

FIG.20

| INPUT | | OUTPUT |
|---|---|---|
| S/H | bitX | OUT |
| H | X | ANALOG INPUT |
| L | H | GND |
| L | L | Vcc |

DIGITAL-TO-ANALOG CONVERTER AND SUCCESSIVE APPROXIMATION TYPE ANALOG-TO-DIGITAL CONVERTER INCLUDING THE SAME

CROSS-REFERENCE TO RELATED APPLICATIONS

This application is based upon and claims the benefit of priority of the prior Japanese Patent Application No. 2009-094839, filed on Apr. 9, 2009, the entire contents of which are incorporated herein by reference.

FIELD

The embodiments relate to digital-to-analog converters and successive approximation type analog-to-digital converters including the same.

BACKGROUND

A general analog-to-digital converter (ADC) converts a change in an analog input with respect to a reference voltage into a digital code. The reference voltage is supplied to the ADC, separately from power supply and ground voltages.

The applicant is aware of a Japanese Laid-Open Patent Publication No. 55-165025.

SUMMARY

One aspect of the embodiments is to provide a digital-to-analog converter and a successive approximation type analog-to-digital converter including the same, which do not require power generating units or power supplies for supplying reference voltages thereto.

According to one aspect of the embodiments, there is provided a digital-to-analog converter comprising an intermediate potential generating circuit configured to generate a voltage from a first power supply voltage and a second power supply voltage; a reference voltage generating circuit, including one or a plurality of first capacitors coupled in parallel, configured to generate an upper limit reference voltage and a lower limit reference voltage for a reference width which regards the voltage generated in the intermediate potential generating circuit as an intermediate potential; a digital code generating circuit, including second capacitors coupled in parallel and having a capacitance ratio corresponding to a binary weighting value for representing a digital code, configured to convert a change in an analog input signal with respect to the upper limit reference voltage and the lower limit reference voltage that are generated in the reference voltage generating circuit into the digital code, and to output the digital code; and a control circuit configured to control the intermediate potential generating circuit, the reference voltage generating circuit and the digital code generating circuit, in order to achieve a sample and hold of the analog input signal, wherein the control circuit controls the reference voltage generating circuit to charge each first capacitor by supplying thereto the analog input signal using the voltage from the intermediate potential generating circuit as a center voltage during a sample time in which the analog input signal is sampled, and to supply the first power supply voltage or the second power supply voltage to each charged first capacitor during a hold time in which the digital code is output.

It is to be understood that both the foregoing general description and the following detailed description are exemplary and explanatory and are not restrictive of the invention, as claimed.

BRIEF DESCRIPTION OF THE DRAWINGS

FIG. 13 is a diagram illustrating a table indicating connections of the CDAC corresponding to each reference width that is adjusted in steps in the ADC in the second example of the embodiment;

FIG. 18 is a diagram illustrating a table for explaining an operation of the reference voltage generating switch circuit of FIG. 17;

FIG. 20 is a diagram illustrating a table for explaining an operation of the digital code generating switch circuit of FIG. 19.

DESCRIPTION OF EMBODIMENTS

Figure 1:
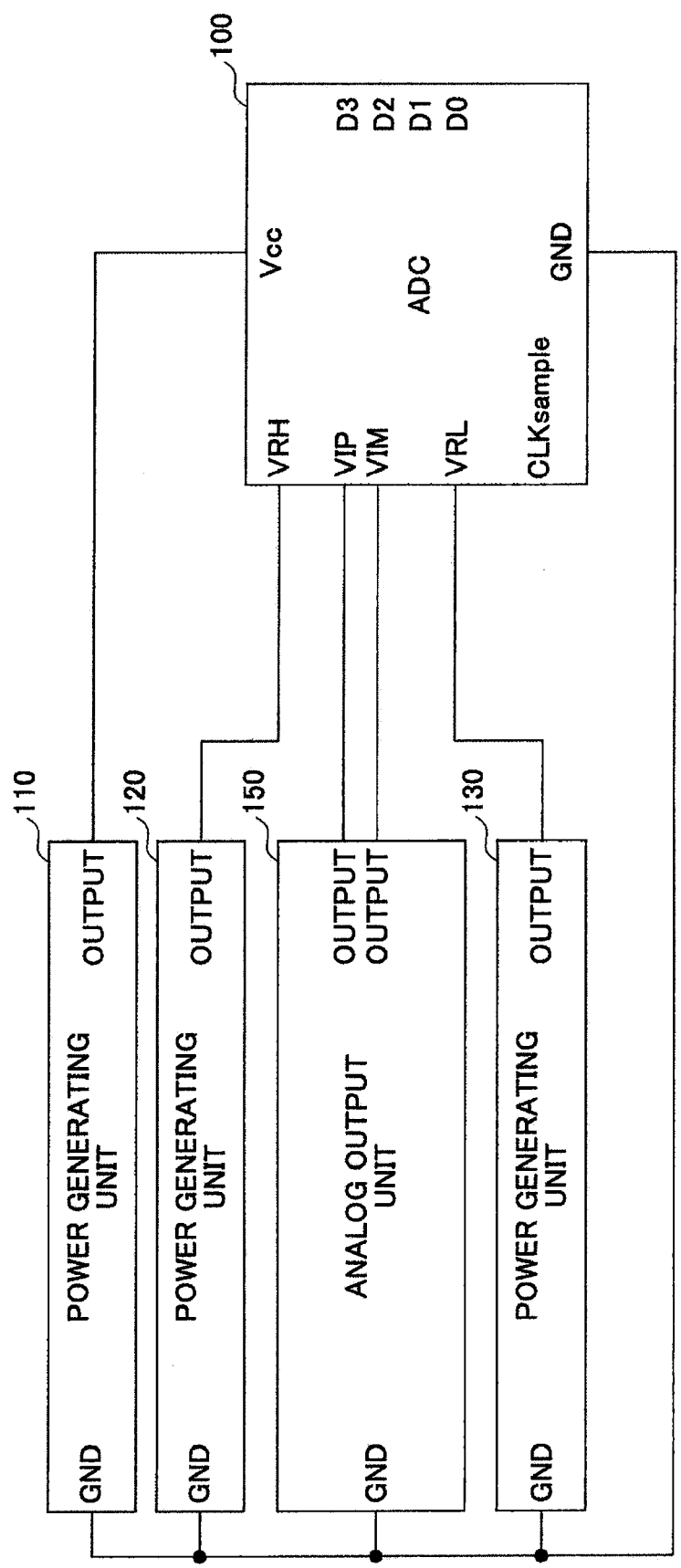
FIG. 1 is a block diagram illustrating a first example of a power supply system for the ADC.

FIG. 1 illustrates a first example of a power supply system for the ADC. In FIG. 1, a first power generating unit 110 generates a power supply voltage Vcc for operating an ADC 100. GND denotes a ground voltage. A second power generating unit 120 generates an upper limit reference voltage VRH, and a third power generating unit 130 generates a lower limit reference voltage VRL. The ADC 100 is supplied with the reference voltages VRH and VRL that are generated by the second and third power generating units 120 and 130, in addition to the power supply voltage Vcc from the first power generating unit 110. The ADC 100 uses the reference voltages VRH and VRL in order to convert analog input signals VIP and VIM which are supplied from an analog output unit 150 into a digital code. The second and third power generating units 120 and 130 generate the reference voltages VRH and VRL so that a reference width VRH−VRL becomes equal to an amplitude of the analog input signal VIP or VIM.

Figure 2:
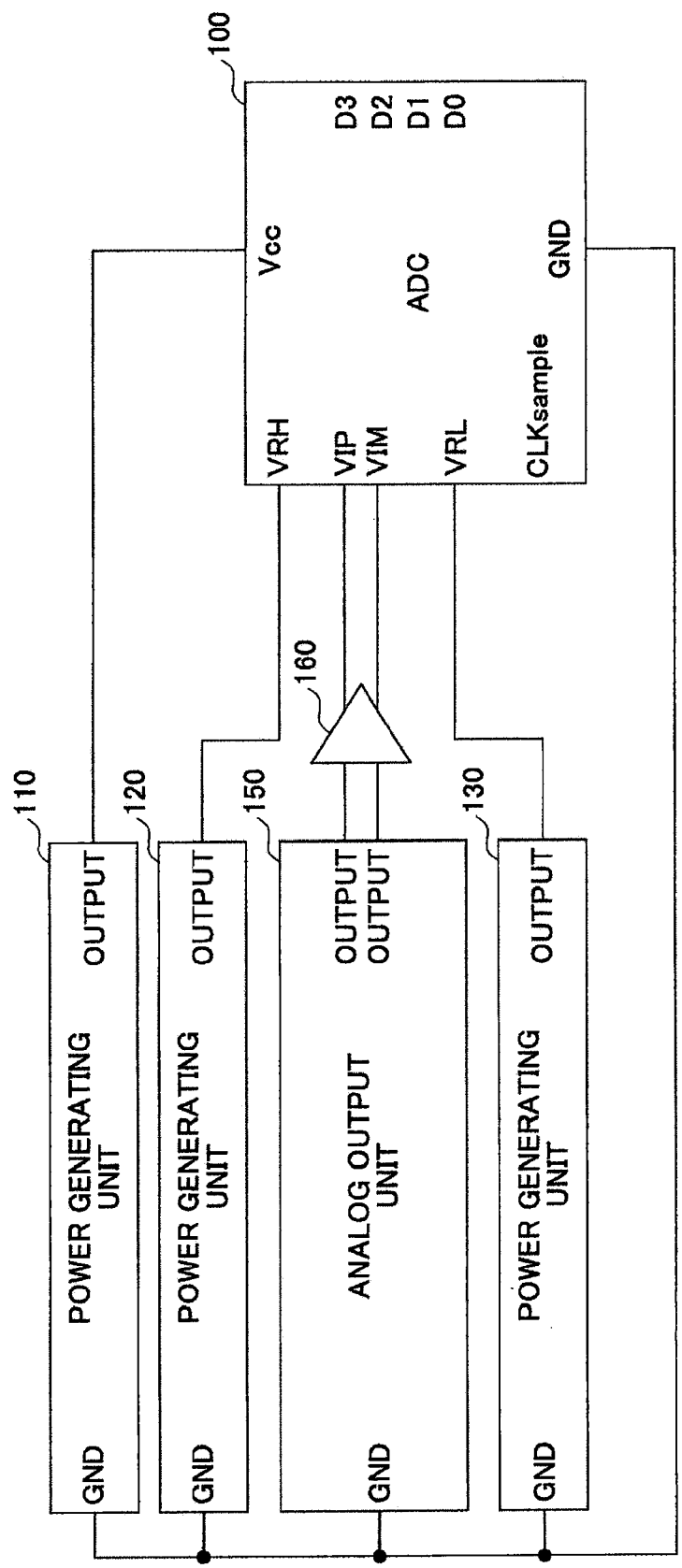
FIG. 2 is a block diagram illustrating a second example of the power supply system for the ADC.

FIG. 2 illustrates a second example of the power supply system for the ADC. In FIG. 2, the reference width VRH−VRL is set in advance, and the second and third power generating units 120 and 130 respectively generate the reference voltages VRH and VRL that are constant regardless of the amplitude of the analog input signal VIP or VIM. A gain control unit 160 is provided at the output of the analog output unit 150, that is, at the input of the ADC 100. The gain control unit 160 controls the gain so that the amplitude of the analog input signal VIP or VIM that is output from the analog output unit 150 becomes equal to the reference width VRH−VRL.

The power supply system for the ADC 100 may include at least three voltage generating units 110, 120 and 130.

Preferred embodiments of the present invention will be described with reference to FIG. 4 and the subsequent drawings.

First, a description will be given of the reasons the ADC 100 illustrated in FIGS. 1 and 2 require the reference voltages VRH and VRL to be input from the power generating units 120 and 130 that are external to the ADC 100, by referring to FIGS. 3 and 4.

Figure 3:
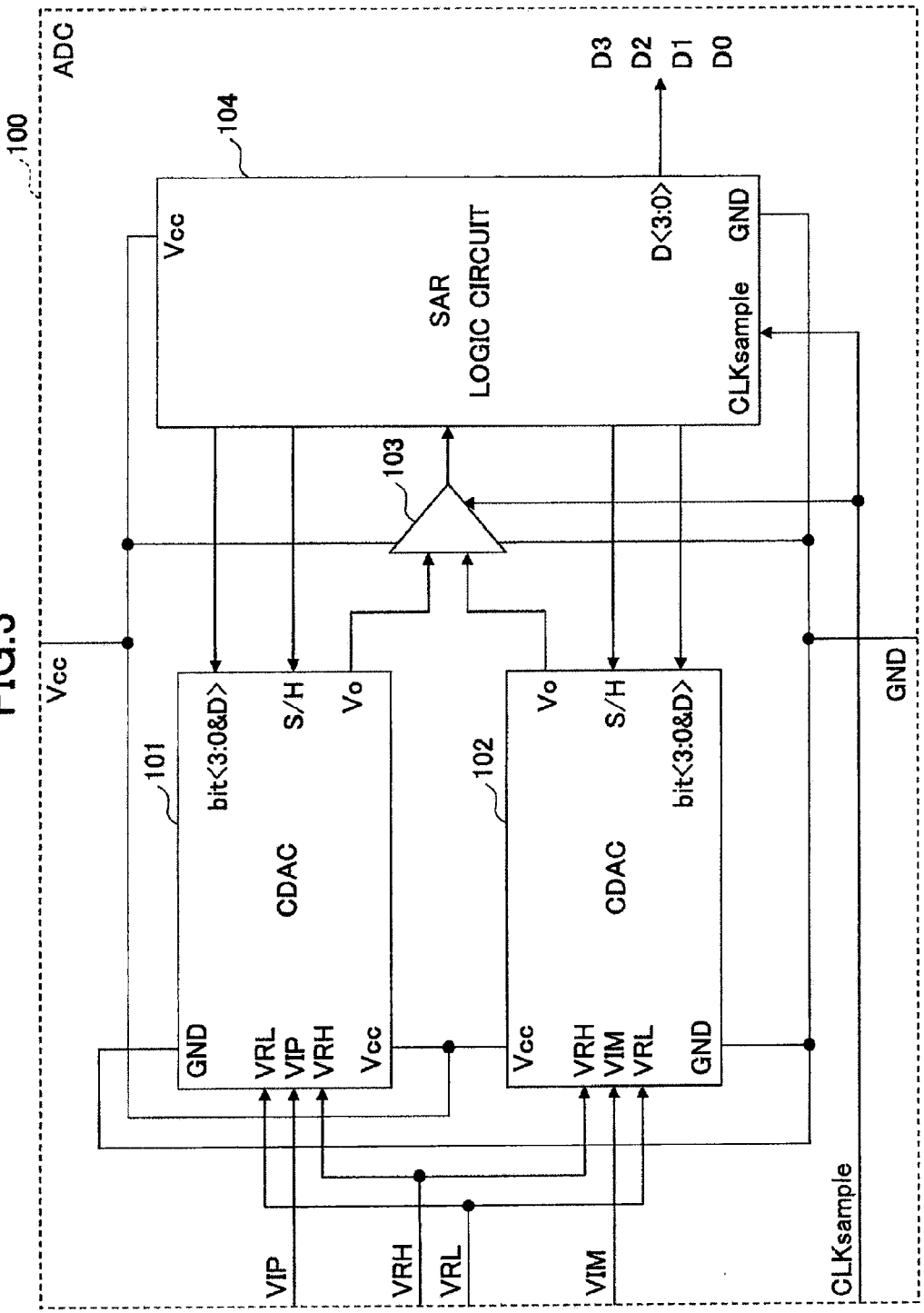
FIG. 3 is a block diagram illustrating a conceivable internal structure of the ADC in FIGS. 1 and 2.

FIG. 3 is a block diagram illustrating a conceivable internal structure of the ADC 100 in FIGS. 1 and 2. For example, the ADC 100 may be formed by a capacity type digital-to-analog converter (CDAC) that includes a successive approximation type ADC. The ADC 100 of FIG. 3 includes two CDACs 101 and 102 that are differential circuits, a comparator 103, and a successive approximation register (SAR) logic circuit 104.

The CDAC 101 samples the analog input signal VIP input from the analog output unit 150 illustrated in FIG. 1 or FIG. 2, based on the reference voltages VRH and VRL, and outputs a digital code Vo. Similarly, the CDAC 101 samples the analog input signal VIM input from the analog output unit 150 illustrated in FIG. 1 or FIG. 2, based on the reference voltages VRH and VRL, and outputs a digital code Vo.

The comparator 103 compares the digital codes Vo output from the CDACs 101 and 102, and outputs a binary code "1" or "0" depending on a comparison result.

The SAR logic circuit 104 stores an output signal of the comparator 103 in a 4-bit register thereof, for example. The SAR logic circuit 104 supplies to the CDACs 101 and 102 a sample and hold switching signal S/H that switches the CDACs 101 and 102 between a sample state and a hold state. The SAR logic circuit 104 also supplies a bit output control signal "bit" to the CDACs 101 and 102. The CDACs 101 and 102 successively output the digital codes (or digital data signals) Vo respectively corresponding to the sampled analog input signals VIP and VIM during a hold time, in response to the bit output control signal "bit". After the hold time ends, the SAR logic circuit 104 outputs a 4-bit digital data stored in the 4-bit register thereof.

Figure 4:
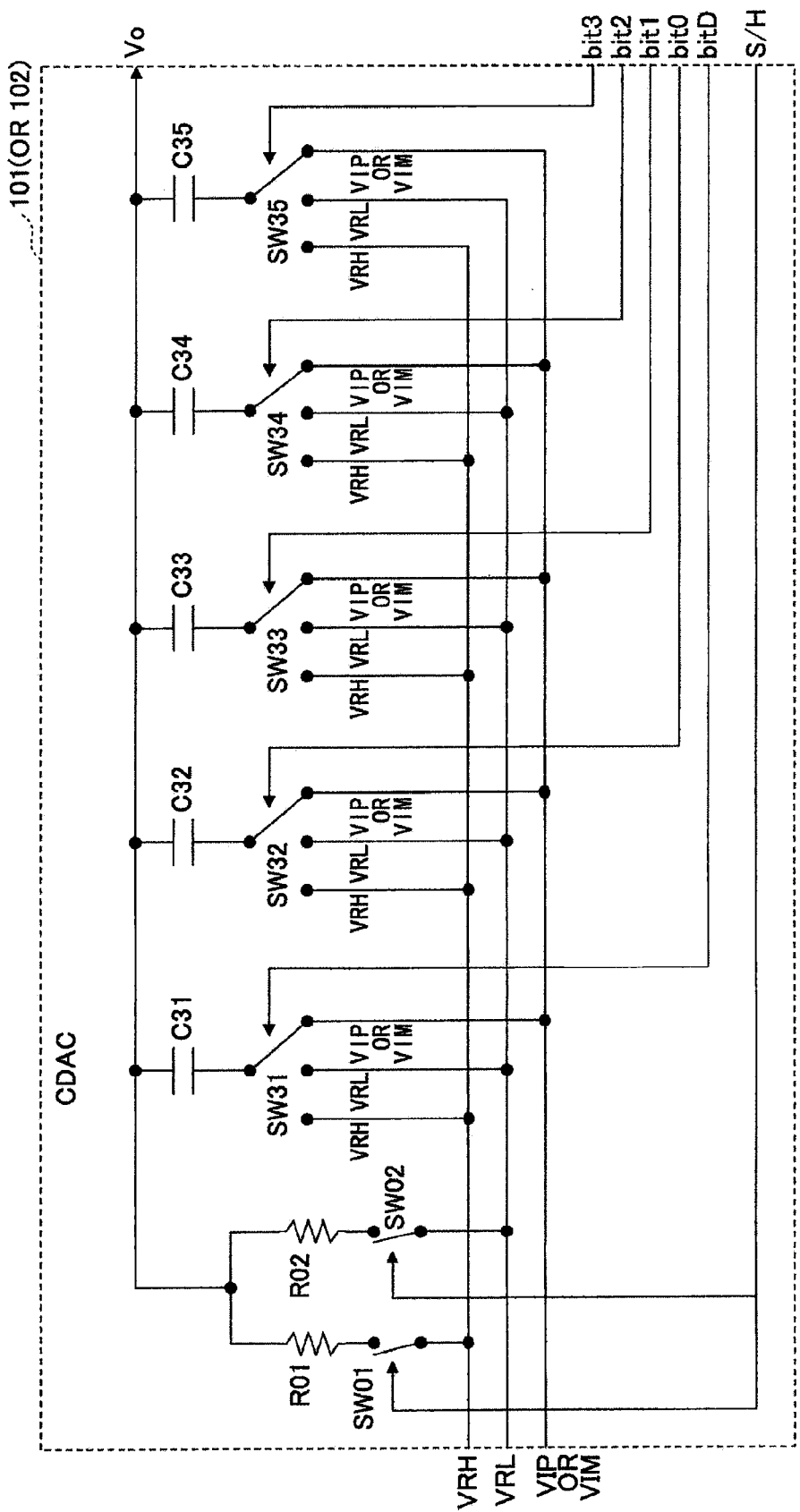
FIG. 4 is a circuit diagram illustrating a capacity type digital-to-analog converter (CDAC) in FIG. 3.

FIG. 4 is a circuit diagram illustrating the CDAC 101 in FIG. 3. Of course, the CDAC 102 in FIG. 3 may have the same structure as the CDAC 101 illustrated in FIG. 4.

The CDAC 101 is formed by a charge redistribution type DAC, and converts a change in the analog input signal VIP or VIM with respect to the reference voltages VRH and VRL into the digital code Vo. The CDAC 101 includes 5 capacitors C31, C32, C33, C34 and C35 having a capacitance ratio 1:1:2:4:8. The capacitance ratio of the 5 capacitors C31, C32, C33, C34 and C35 corresponds to a binary weighting value for representing the 4-bit digital code Vo. The 5 capacitors C31, C32, C33, C34 and C35 are connected in parallel.

The CDAC 101 also includes a series circuit in which resistors R01 and R02 are connected in series. One end of the series circuit receives the reference voltage VRH via a switching element SW01, and the other end of the series circuit receives the reference voltage VRL via a switching element SW02. The switching elements SW01 and SW02 are closed during a sample time and are open during the hold time, in response to the sample and hold switching signal S/H from the SAR logic circuit 104 of FIG. 3. A node connecting the resistors R01 and R02 is connected to one end of each of the 5 capacitors C31, C32, C33, C34 and C35.

The CDAC 101 further includes switching elements SW31, SW32, SW33, SW34 and SW35 that are connected in series to the corresponding capacitors C31, C32, C33, C34 and C35. For example, the switching elements SW31, SW32, SW33, SW34 and SW35 receives one of the reference voltage VRH, the reference voltage VRL and the analog input signal VIP or VIM, in response to the bit output control signal "bit" from the SAR logic circuit 104 of FIG. 3. During the sample time, the capacitors C31, C32, C33, C34 and C35 receives the analog input signal VIP or VIM from the corresponding switching elements SW31, SW32, SW33, SW34 and SW35. Hence, the analog input signal VIP or VIM is sampled when a charge corresponding to the analog input signal VIP or VIM is accumulated in the capacitors C31, C32, C33, C34 and C35 in the sample state. During the hold time, the switching elements SW31, SW32, SW33, SW34 and SW35 are switched in order to supply the reference voltage VRH or VRL to the capacitors C31, C32, C33, C34 and C35. Accordingly, the CDAC 101 or 102 outputs the digital code (or digital data signal) Vo corresponding to the analog input signal VIP or VIM that charged the capacitors C31, C32, C33, C34 and C35 in the sample state.

As may be understood from the above, the ADC 100 illustrated in FIGS. 1 and 2 require the reference voltages VRH and VRL to be input from the power generating units 120 and 130 that are external to the ADC 100.

Next, a description will now be given of the digital-to-analog converter and the successive approximation type analog-to-digital converter including the same in each embodiment according to the present invention.

Figure 5:
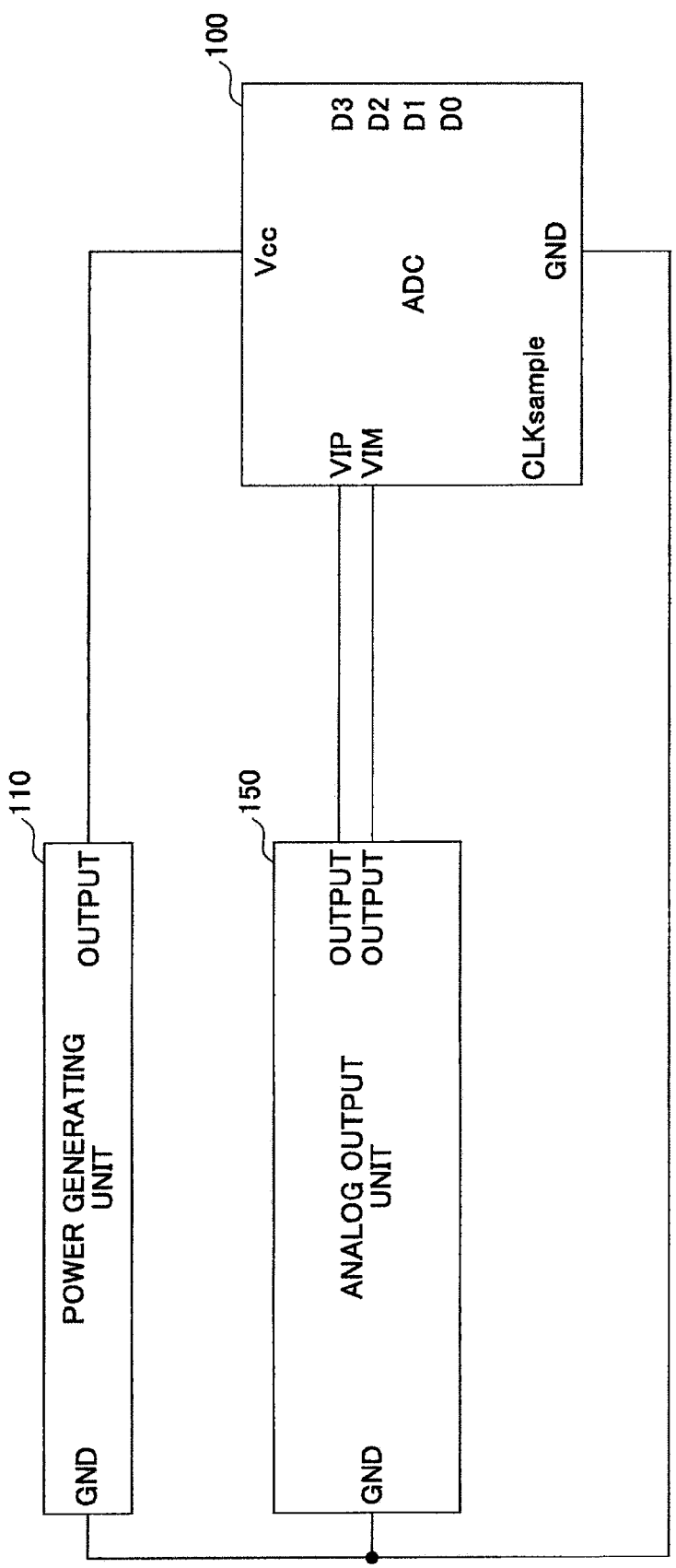
FIG. 5 is a block diagram illustrating a power supply system for the ADC in an embodiment.

FIG. 5 is a block diagram illustrating a power supply system for the ADC in an embodiment. The power supply system illustrated in FIG. 5 differs from the power supply system of FIGS. 1 and 2 in that the power generating units 120 and 130 for generating the reference voltages VRH and VRL are not provided with respect to an ADC 500 in FIG. 5.

Figure 6:
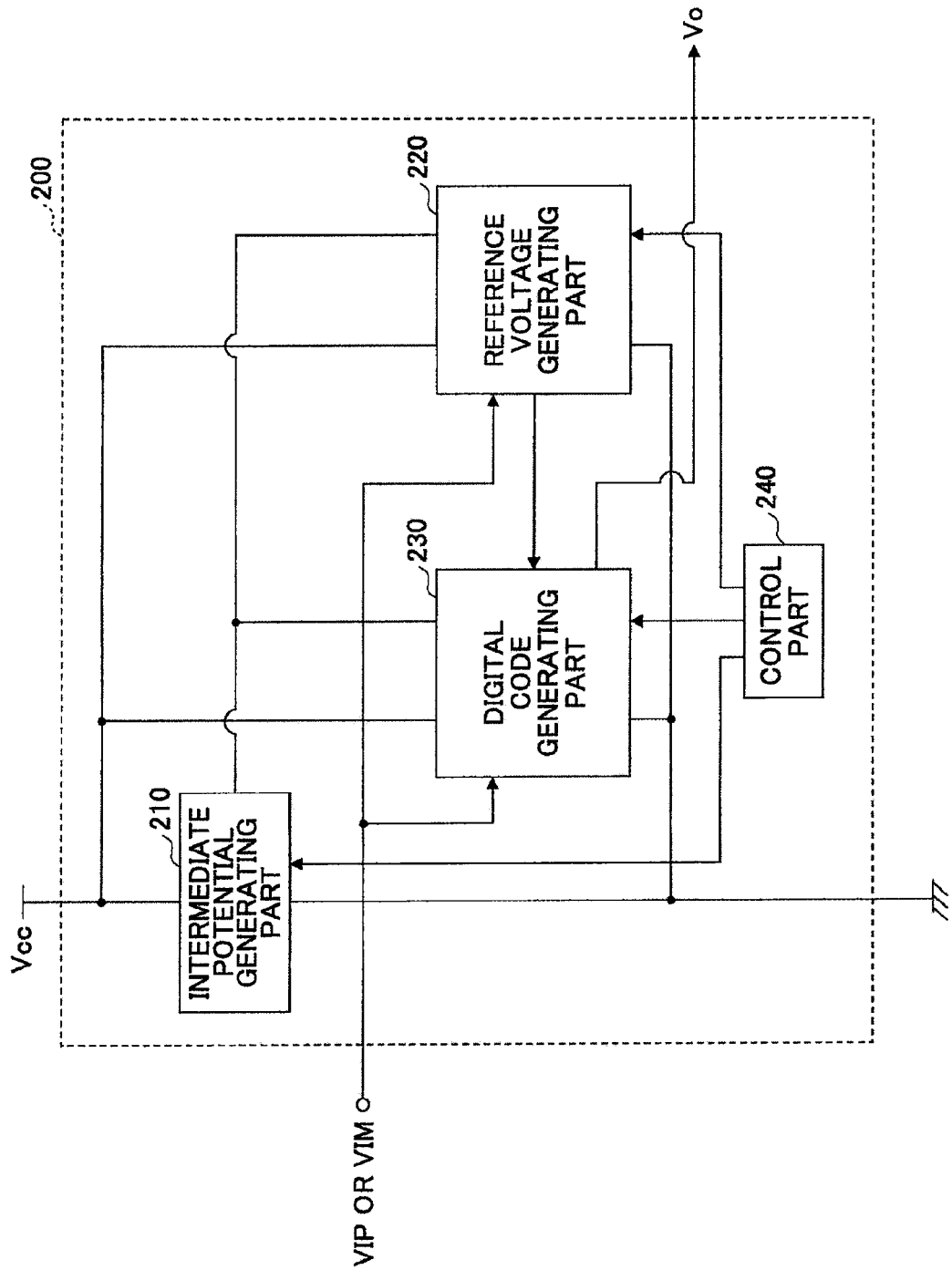
FIG. 6 is a block diagram illustrating a CDAC included in the ADC in accordance with the embodiment.

FIG. 6 is a block diagram illustrating a CDAC included in the ADC 500 in accordance with this embodiment. A CDAC 200 illustrated in FIG. 6 is formed by a charge redistribution type CDAC, and includes a digital code generating part (or circuit) 230 having a structure that is substantially the same as that of the CDAC 101 or 102 of FIG. 4, for example. The CDAC 200 further includes an intermediate potential generating part (or circuit) 210, a reference voltage generating part (or circuit, or internal reference voltage generating part or circuit) 220, and a control part (or circuit) 240.

The intermediate potential generating part 210 generates a predetermined voltage having an intermediate potential), based on a power supply voltage (or a first power supply voltage) Vcc and a ground voltage (or a second power supply voltage) GND supplied from the power generating unit 110 illustrated in FIG. 5, for example. The reference voltage generating part 220 generates an upper limit reference voltage and a lower limit reference voltage for a predetermined reference width which regards the voltage generated in the intermediate potential generating part 210 as the intermediate potential. The digital code generating part 230 converts a change in the analog input signal VIP or VIM with respect to the upper limit reference voltage and the lower limit reference voltage that are generated in the reference voltage generating part 220 into the digital code Vo, and outputs the digital code Vo. The control part 240 controls each part of the CDAC 200, including the intermediate potential generating part 210, the reference voltage generating part 220 and the digital code generating part 230, in order to achieve the sample and hold of the analog input signal VIP or VIM. The control part 240 may be a part of a controller (not illustrated) that controls the entire operation of the ADC 500.

For example, the ADC 500 may be formed by a 4-bit ADC that outputs a 4-bit digital data.

First Example of Embodiment

Figure 7:
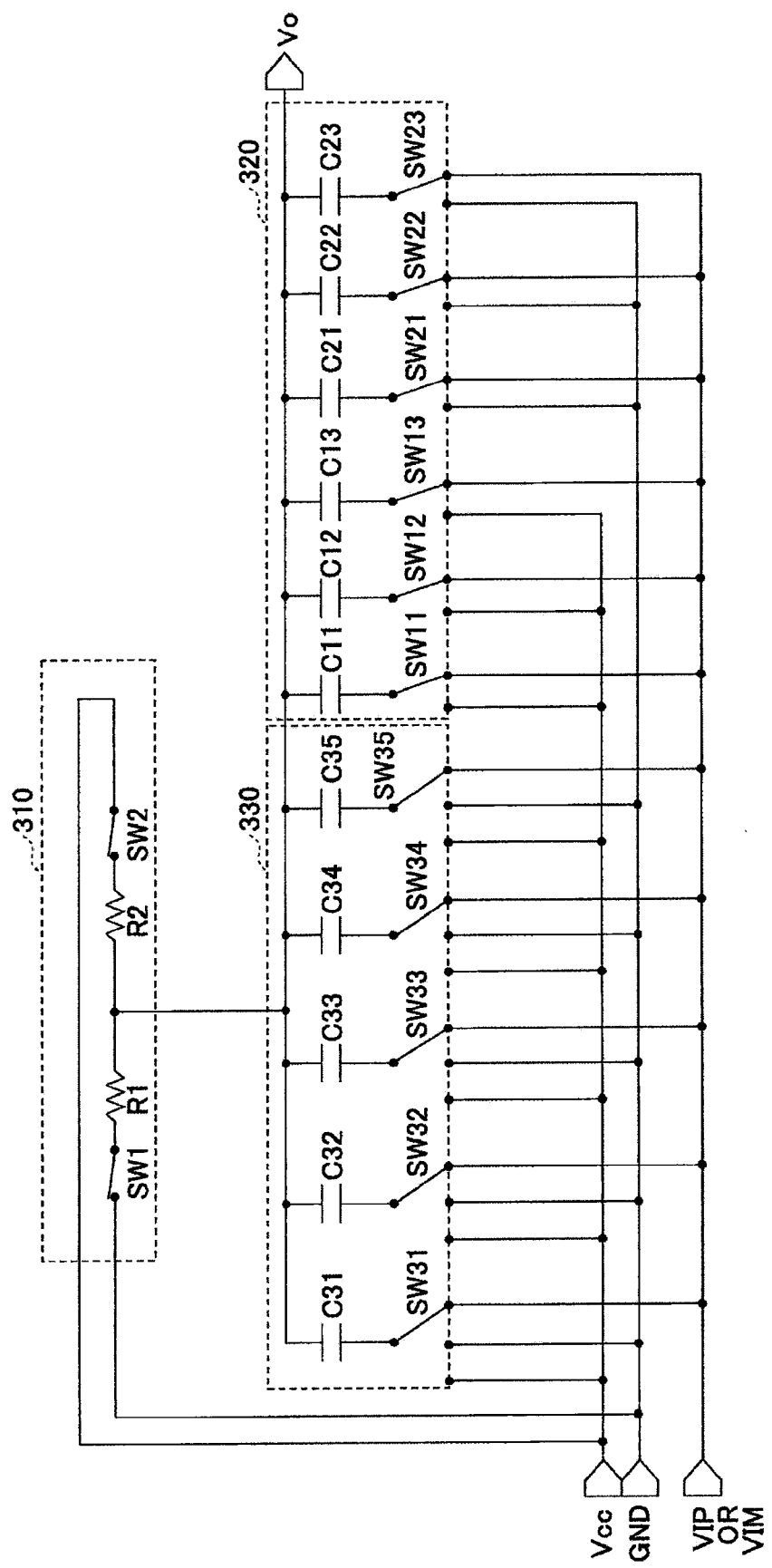
FIG. 7 is a circuit diagram illustrating the CDAC included in the ADC in a first example of the embodiment in a sample state.
Figure 8:
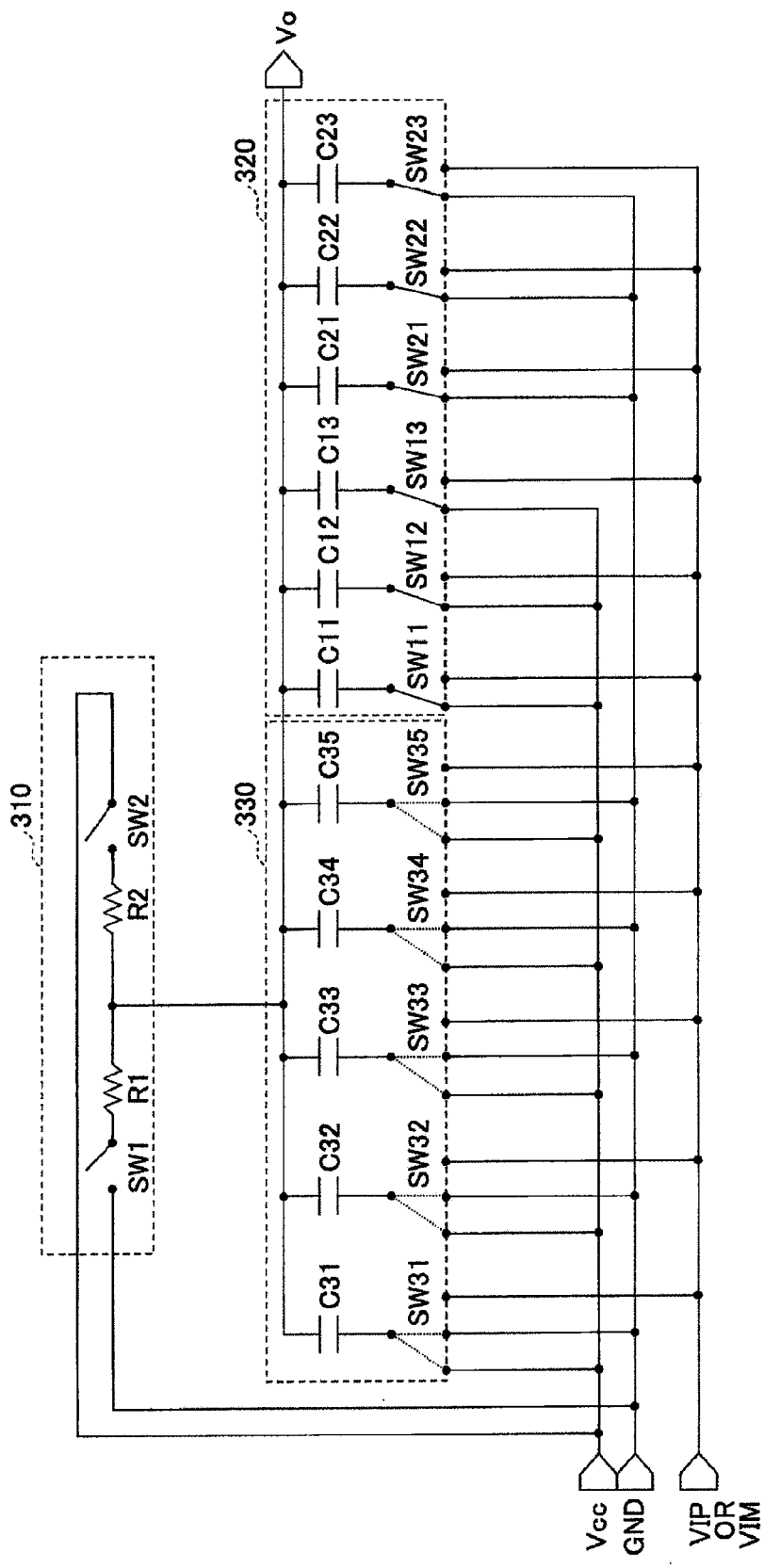
FIG. 8 is a circuit diagram illustrating the CDAC included in the ADC in the first example of the embodiment in a hold state.

FIG. 7 is a circuit diagram illustrating the CDAC 200 included in the ADC 500 in a first example of the embodiment in the sample state, and FIG. 8 is a circuit diagram illustrating the CDAC 200 included in the ADC 500 in the first example of the embodiment in the hold state. FIGS. 7 and 8 illustrate a circuit part corresponding to the intermediate potential generating part 210, the reference voltage generating part 220 and the digital code generating part 230 of the CDAC 200 of FIG. 6, for example.

In FIG. 7, an intermediate potential generating circuit 310 generates a predetermined voltage having an intermediate potential, based on the power supply voltage Vcc and the ground voltage GND that are supplied from an external power generating unit. The intermediate potential generating circuit 310 includes resistors R1 and R2, and switching elements SW1 and SW2. The switching elements SW1 and SW2 are opened and closed by the control part 240 illustrated in FIG. 6. In the sample state, the switching elements SW1 and SW2 are closed in order to form a voltage divider by the resistors R1 and R2.

The reference voltage generating circuit 320 includes 3 capacitors C11, C12 and C13 having a capacitance ratio 1:2:4, and 3 capacitors C21, C22 and C23 having a capacitance ratio 1:2:4. The capacitors C11, C12, C13, C21, C22 and C23 are connected in parallel. One end of each of the capacitors C11, C12, C13, C21, C22 and C23 is connected to an output of the intermediate potential generating circuit 310, that is, to a node connecting the resistors R1 and R2. The reference voltage generating circuit 320 also includes switching elements SW11, SW12, SW13, SW21, SW22 and SW23 respectively connected in series to other ends of the corresponding capacitors C11, C12, C13, C21, C22 and C23. The switching elements SW11, SW12 and SW13 supply the power supply voltage Vcc or the analog input signal VIP or VIM to a first group of capacitors C11, C12 and C13, in response to a control signal from the control part 240 illustrated in FIG. 6. The switching elements SW21, SW22 and SW23 supply the ground voltage GND or the analog input signal VIP or VIM to a second group of capacitors C21, C22 and C23, in response to a control signal from the control part 240 illustrated in FIG. 6. In the sample state, the first group of capacitors C11, C12 and C13 and the second group of capacitors C21, C22 and C23 receive the analog input signal VIP or VIM via the corresponding switching elements SW11, SW12, SW13, SW21, SW22 and SW23, as illustrated in FIG. 7. Hence, the capacitors C11, C12, C13, C21, C22 and C23 are charged by the analog input signal VIP or VIM.

The digital code generating circuit 330 includes 5 capacitors C31, C32, C33, C34 and C35 having a capacitance ratio 1:1:2:4:8. This capacitance ratio of the capacitors C31, C32, C33, C34 and C35 corresponds to a binary weighting value for representing a 4-bit digital code. The capacitors C31, C32, C33, C34 and C35 are connected in parallel. One end of each of the capacitors C31, C32, C33, C34 and C35 is connected to the output of the intermediate potential generating circuit 310, that is, to the node connecting the resistors R1 and R2. The digital code generating circuit 330 also includes switching elements SW31, SW32, SW33, SW34 and SW35 respectively connected in series to the other ends of the corresponding capacitors C31, C32, C33, C34 and C35. For example, the switching elements SW31, SW32, SW33, SW34 and SW35 supply one of the power supply voltage Vcc, the ground voltage GND, the analog input signal VIP and the analog input signal VIM to the capacitors C31, C32, C33, C34 and C35, in response to a control signal from the control part 240 illustrated in FIG. 6. In the sample state, the capacitors C31, C32, C33, C34 and C35 receive the analog input signal VIP or VIM via the corresponding switching elements SW31, SW32, SW33, SW34 and SW35, as illustrated in FIG. 7. Hence, the capacitors C31, C32, C33, C34 and C35 are charged by the analog input signal VIP or VIM.

In the hold state, the switching elements SW1 and SW2 of the intermediate potential generating circuit 310 illustrated in FIG. 8 are opened, in response to the control signal from the control part 240 illustrated in FIG. 6. Hence, in the hold state, the intermediate potential generating circuit 310 does not generate the predetermined voltage having the intermediate potential.

The switching elements SW11, SW12, SW13, SW21, SW22 and SW23 of the reference voltage generating circuit 320 switch to supply the power supply voltage Vcc or the ground voltage GND to the capacitors C11, C12, C13, C21, C22 and C23, in response to the control signal from the control part 240. In the hold state, the power supply voltage Vcc is supplied to the first group of capacitors C11, C12 and C13 via the switching elements SW11, SW12 and SW13, and the ground voltage GND is supplied to the second group of capacitors C21, C22 and C23 via the switching elements SW21, SW22 and SW23.

The switching elements SW31, SW32, SW33, SW34 and SW35 of the digital code generating circuit 330 switch to supply the power supply voltage Vcc or the ground voltage GND to the capacitors C31, C32, C33, C34 and C35, in response to the control signal from the control part 240. During hold time, the digital code generating circuit 330 outputs the digital data signal Vo corresponding to the analog input signal VIP or VIM which charged the capacitors C31, C32, C33, C34 and C35 in the sample state.

Figure 9:
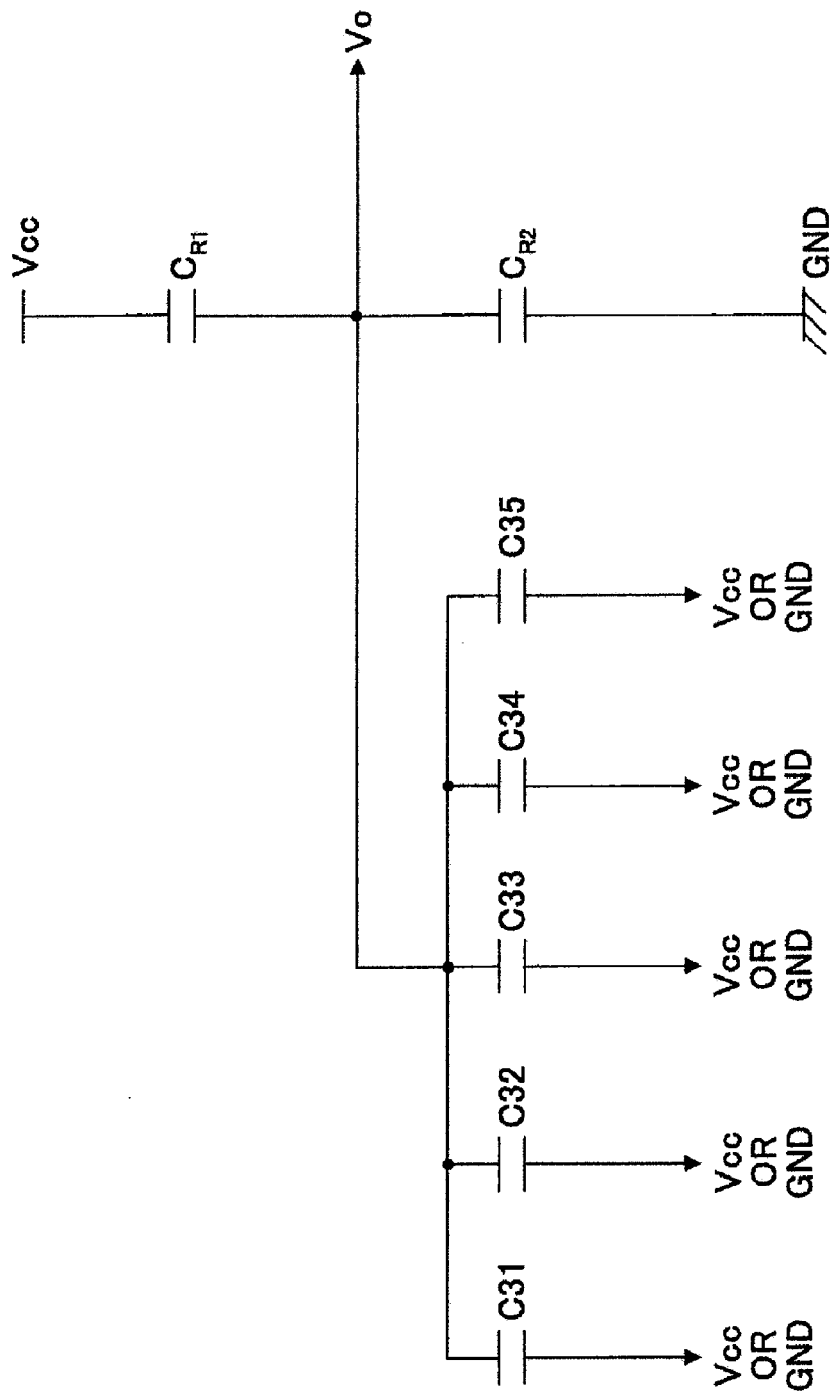
FIG. 9 is a circuit diagram illustrating an equivalent circuit of a circuit part of FIG. 8 in the hold state.

FIG. 9 is a circuit diagram illustrating an equivalent circuit of the circuit part of FIG. 8 in the hold state. The equivalent circuit includes a series circuit in which an upper limit reference capacitor $C_{R1}$ receiving the power supply voltage Vcc and a lower limit reference capacitor $C_{R2}$ receiving the ground voltage GND are connected in series. The upper limit reference capacitor $C_{R1}$ has a capacitance corresponding to a sum of the capacitances of the first group of capacitors C11, C12 and C13, that is, $1Co+2Co+4Co=7Co$, where Co is an arbitrary constant. On the other hand, the lower limit reference capacitor $C_{R2}$ has a capacitance corresponding to a sum of the capacitances of the second group of capacitors C21, C22 and C23, that is, 1Co+2Co+4Co=7Co. A node connecting the capacitors $CR_1$ and $CR_2$ is connected to a parallel circuit in which the capacitors C31, C32, C33, C34 and C35 of the digital code generating circuit 330 are connected in parallel. A sum of the capacitances of the capacitors C31, C32, C33, C34 and C35 is 1Co+1Co+2Co+4Co+9Co=16Co.

In the sample state, the analog input signal VIP or VIM charges the capacitors $CR_1$ and $CR_2$ and the capacitors C31, C32, C33, C34 and C35 using the voltage generated in the intermediate potential generating circuit 310 as a center voltage. For this reason, in the hold state, the reference voltage generating circuit 320 generates the reference voltages VRH and VRL in order to obtain a reference width {16·(Vcc−0)/(7+7+16)} having the voltage generated in the intermediate potential generating circuit 310 as the intermediate potential. In order to obtain a desired reference width, the reference voltage generating circuit 320 attenuates the power supply voltage Vcc and the ground voltage GND which are originally used as the reference voltages VRH and VRL. Hence, the ADC 500 in accordance with the first example of this embodiment can internally generate the reference voltages VRH and VRL from the power supply voltage Vcc and the ground voltage GND.

Figure 10:
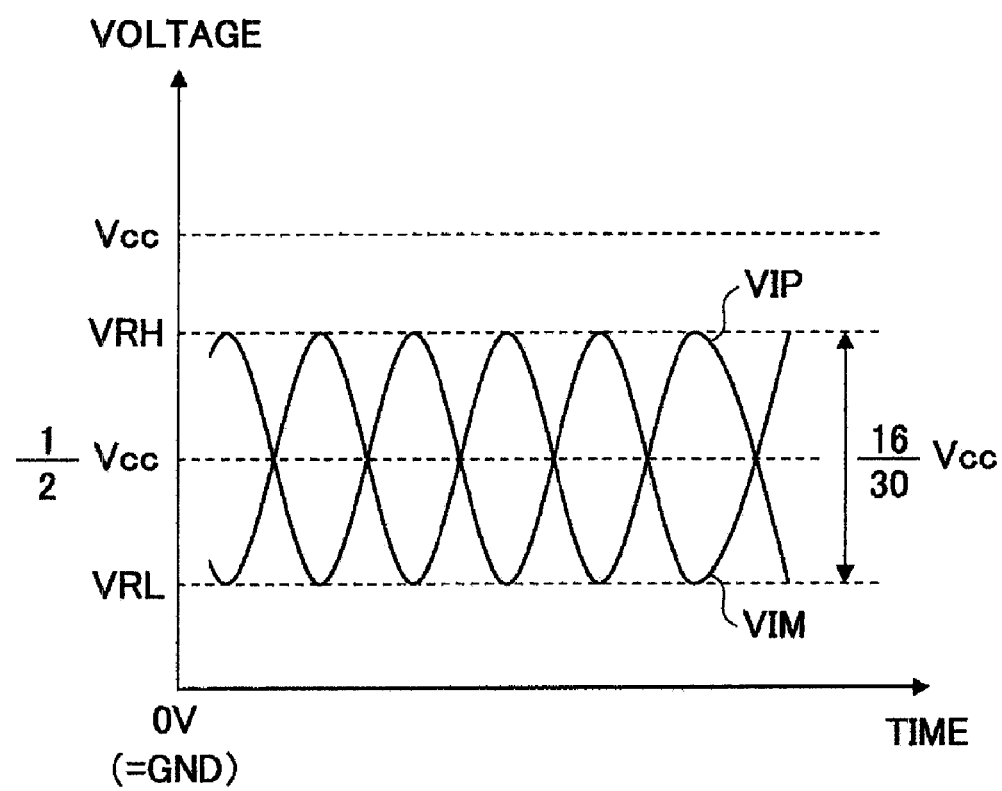
FIG. 10 is a diagram illustrating a relationship among reference voltages generated within the ADC in accordance with the first example of the embodiment and an analog input signal.

FIG. 10 is a diagram illustrating a relationship among the reference voltages VRH and VRL generated within the ADC 500 in accordance with the first example of this embodiment and the analog input signal VIP or VIM. In FIG. 10, the ordinate indicates the voltage in arbitrary units, and the abscissa indicates the time in arbitrary units. If the resistors R1 and R2 of the intermediate potential generating circuit 310 have the same resistance, for example, the intermediate potential generating circuit 310 generates a voltage Vcc/2. The reference voltages VRH and VRL having the intermediate potential Vcc/2 and a reference width (16/30)Vcc are generated within the ADC 500. The reference voltages VRH and VRL are determined based on the number of capacitors used and the capacitances thereof in the reference voltage generating circuit 320, namely, the 6 capacitors C11, C12, C13, C21, C22 and C23 and the capacitances thereof in this first example. Accordingly, the reference voltages VRH and VRL change if the capacitors C11, C12, C13, C21, C22 and C23 are formed by capacitors having variable capacitances. On the other hand, if the capacitances of the capacitors C11, C12, C13, C21, C22 and C23 are fixed, a gain control unit (not illustrated) may be provided at the input of the ADC 500 in order to control the amplitude of the analog input signals VIP and VIM to become equal to a predetermined reference width VRH−VRL, in a manner similar to the power supply system illustrated in FIG. 2.

Second Example of Embodiment

Figure 11:
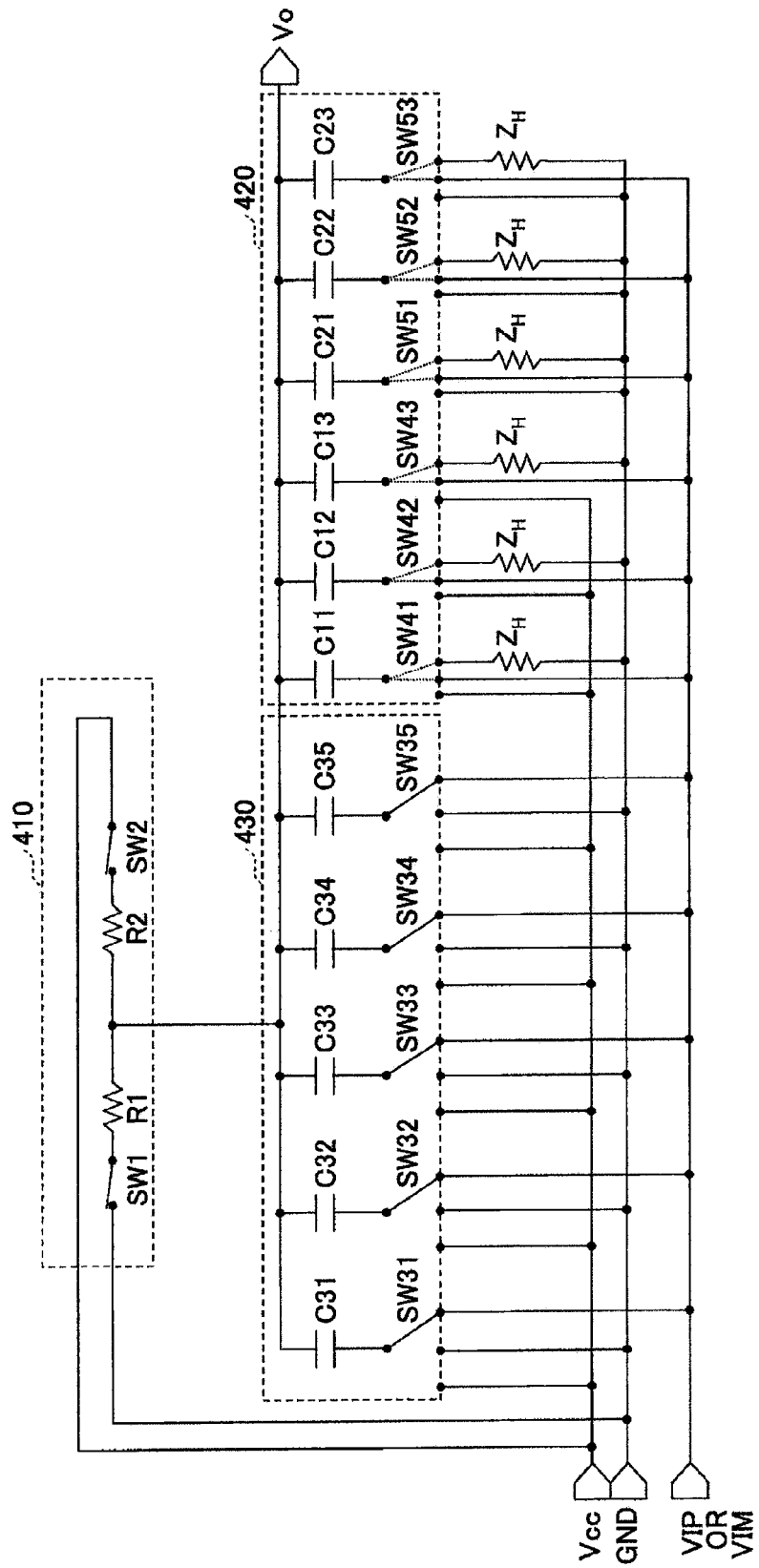
FIG. 11 is a circuit diagram illustrating the CDAC included in the ADC in a second example of the embodiment in a sample state.
Figure 12:
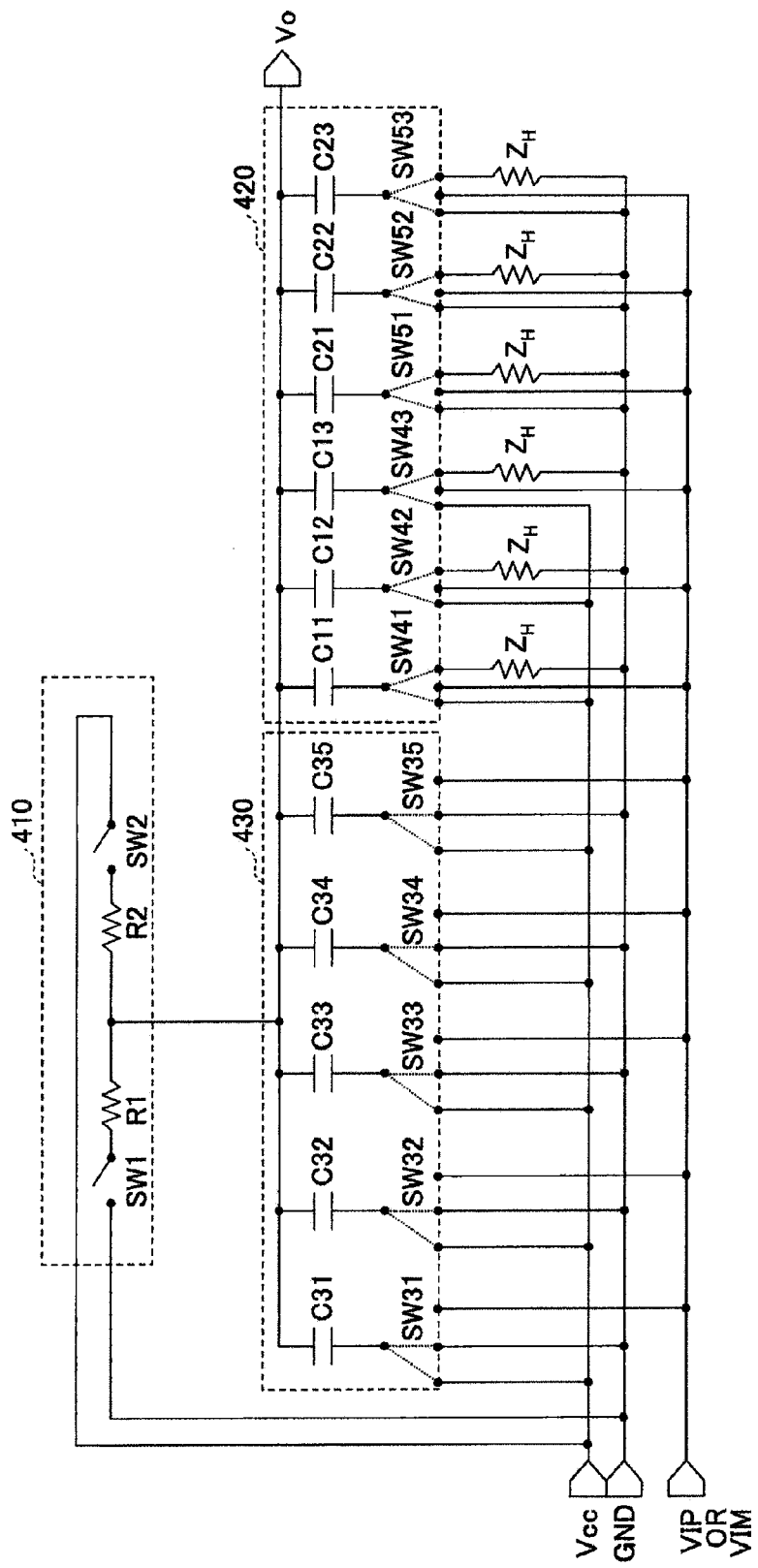
FIG. 12 is a circuit diagram illustrating the CDAC included in the ADC in the second example of the embodiment in a hold state.

FIG. 11 is a circuit diagram illustrating the CDAC 200 included in the ADC 500 in a second example of this embodiment in the sample state, and FIG. 12 is a circuit diagram illustrating the CDAC 200 included in the ADC 500 in the second example of this embodiment in the hold state. FIGS. 11 and 12 illustrate a circuit part corresponding to the intermediate potential generating part 210, the reference voltage generating part 220 and the digital code generating part 230 of the CDAC 200 of FIG. 6, for example. Structures of an intermediate potential generating circuit 410 and a digital code generating circuit 430 illustrated in FIGS. 11 and 12 are substantially the same as those of the intermediate potential generating circuit 310 and the digital code generating circuit 330 illustrated in FIGS. 7 and 8, and a detailed description thereof will be omitted.

In FIG. 11, a reference voltage generating circuit 420 includes 3 capacitors C11, C12 and C13 having a capacitance ratio 1:2:4, and 3 capacitors C21, C22 and C23 having a capacitance ratio 1:2:4. The capacitors C11, C12, C13, C21, C22 and C23 are connected in parallel. One end of each of the capacitors C11, C12, C13, C21, C22 and C23 is connected to an output of the intermediate potential generating circuit 410, that is, to a node connecting the resistors R1 and R2. The reference voltage generating circuit 420 also includes switching elements SW41, SW42, SW43, SW51, SW52 and SW53 respectively connected in series to other ends of the corresponding capacitors C11, C12, C13, C21, C22 and C23. The switching elements SW41, SW42 and SW43 supply the power supply voltage Vcc or the analog input signal VIP or VIM to a first group of capacitors C11, C12 and C13 or, connects the first group of capacitors C11, C12 and C13 to a high impedance state $Z_H$, in response to a control signal from the control part 240 illustrated in FIG. 6. The switching elements SW51, SW52 and SW53 supply the ground voltage GND or the analog input signal VIP or VIM to a second group of capacitors C21, C22 and C23 or, connects the second group of capacitors C21, C22 and C23 to a high impedance state $Z_H$, in response to a control signal from the control part 240 illustrated in FIG. 6. In the sample state, the first group of capacitors C11, C12 and C13 and the second group of capacitors C21, C22 and C23 receive the analog input signal VIP or VIM or, are connected to the high impedance $Z_H$, via the corresponding switching elements SW41, SW42, SW43, SW51, SW52 and SW53, as illustrated in FIG. 11. Hence, each of the capacitors C11, C12, C13, C21, C22 and C23 not connected to the high impedance $Z_H$ in the sample state is charged by the analog input signal VIP or VIM.

In the hold state, the switching elements SW41, SW42 and SW43 of the reference voltage generating circuit 420 switch to supply the power supply voltage Vcc to the capacitors C11, C12 and C13 or, to connect the capacitors C11, C12 and C13 to the high impedance $Z_H$, in response to the control signal from the control part 240. In addition, the switching elements SW51, SW52 and SW53 of the reference voltage generating circuit 420 switch to supply the ground voltage GND to the capacitors C21, C22 and C23 or, to connect the capacitors C21, C22 and C23 to the high impedance $Z_H$, in response to the control signal from the control part 240.

The switching elements SW41, SW42 and SW43 connected to the corresponding capacitors C11, C12 and C13 that were charged by the analog input signal VIP or VIM in the sample state are switched so that the corresponding capacitors C11, C12 and C13 receive the power supply voltage Vcc in the hold state. Similarly, the switching elements SW51, SW52 and SW53 connected to the corresponding capacitors C21, C22 and C23 that were charged by the analog input signal VIP or VIM in the sample state are switched so that the corresponding capacitors C21, C22 and C23 receive the ground voltage GND in the hold state. The switching elements SW41, SW42, SW43, SW51, SW52 and SW53 connected to the corresponding capacitors C11, C12, C13, C21, C22 and C23 that were connected to the high impedance $Z_H$ in the sample state are not switched in the hold state which occurs immediately after (that is, follows) this sample state and continue to be connected to the high impedance $Z_H$.

For example, if all of the capacitors C11, C12, C13, C21, C22 and C23 of the reference voltage generating circuit 420 received the analog input signal VIP or VIM in the sample state, the first group of capacitors C11, C12 and C13 receive the power supply voltage Vcc when the switching elements SW41, SW42 and SW43 are switched in response to the control signal from the control part 240 in the hold state. In addition, the second group of capacitors C21, C22 and C23 receive the ground voltage GND when the switching elements SW51, SW52 and SW53 are switched in response to the control signal form the control part 240 in the hold state. Such a switching of the connection in the CDAC 200 is substantially the same as that of the CDAC 200 of the first example of this embodiment illustrated in FIGS. 7 and 8. For this reason, the reference voltage generating circuit 420 generates the reference voltages VRH and VRL in order to obtain a reference width (16/30)Vcc having the voltage generated in the intermediate potential generating circuit 410 as the intermediate potential.

For example, if the capacitors C12, C13, C22 and C23 of the reference voltage generating circuit 420 received the analog input signal VIP or VIM but the capacitors C11 and C21 were connected to the high impedance $Z_H$ in the sample state, the capacitors C11 and C21 which were connected to the high impedance $Z_H$ in the sample state continue to be connected to the high impedance $Z_H$ in the hold state which occurs immediately after this sample state. However, the capacitors C12 and C13 receive the power supply voltage Vcc when the switching elements SW42 and SW43 are switched in response to the control signal from the control part 240 in the hold state. In addition, the capacitors C22 and C23 receive the ground voltage GND when the switching elements SW52 and SW53 are switched in response to the control signal form the control part 240 in the hold state. In this case, the capacitance of the upper limit reference capacitor $C_{R1}$ in the equivalent circuit in FIG. 9 corresponds to a sum of the capacitances of the capacitors C12 and C13, that is, 2Co+4Co=6Co. Similarly, the capacitance of the lower limit reference capacitor CR1 in the equivalent circuit corresponds to a sum of the capacitances of the capacitors C22 and C23, that is, 2Co+4Co=6Co. For this reason, the reference width VRH−VRL of the reference voltages VRH and VRL generated by the reference voltage generating circuit 420 becomes equal to a reference width {16·(Vcc−0)/(6+6+16)} having the voltage generated in the intermediate potential generating circuit 410 as the intermediate potential. The reference width (16/28)Vcc that is obtained in this case is wider than the reference width (16/30)Vcc that is obtained when none of the capacitors C11, C12, C13, C21, C22 and C23 within the reference voltage generating circuit 420 is connected to the high impedance $Z_H$ in the sample state and the hold state.

For example, if all of the capacitors C11, C12, C13, C21, C22 and C23 of the reference voltage generating circuit 420 were connected to the high impedance $Z_H$ in the sample state, all of the capacitors C11, C12, C13, C21, C22 and C23 continue to be connected to the high impedance $Z_H$ in the hold state which occurs immediately after this sample state. For this reason, the reference width VRH−VRL of the reference voltages VRH and VRL generated by the reference voltage generating circuit 420 becomes equal to a reference width {16·(Vcc−0)/16} having the voltage generated in the intermediate potential generating circuit 410 as the intermediate potential. The reference width (16/16)Vcc that is obtained in this case is equal to the power supply voltage Vcc.

Accordingly, by changing the connections of the capacitors C11, C12, C13, C21, C22 and C23 within the reference voltage generating circuit 420, it becomes possible to adjust the reference width in steps from (16/33)Vcc to Vcc.

FIG. 13 is a diagram illustrating a table indicating the connections of the capacitors C11, C12, C13, C21, C22 and C23 within the CDAC 200 corresponding to each reference width that is adjusted in steps in the ADC 500 in the second example of this embodiment. The table in FIG. 13 illustrates the connections of the capacitors C11, C12, C13, C21, C22 and C23 within the reference voltage generating circuit 420 in correspondence with the reference width that is adjusted in steps. FIG. 13 represents the reference width in 8 reference levels 0 through 7, where the reference width becomes wider as the reference level increases. For example, the reference level 0 indicates the minimum reference width (=(16/30)Vcc), and the reference level indicates the maximum reference width (=Vcc).

At the reference level 0, all of the capacitors C11, C12, C13, C21, C22 and C23 of the reference voltage generating circuit 420 receive the analog input signal VIP or VIM in the sample state, as indicated by "ANALOG" in FIG. 13. On the other hand, when a transition is made from the sample state to the hold state, the switching elements SW41, SW42, SW43, SW51, SW52 and SW53 are switched, so that the first group of capacitors C11, C12 and C13 receive the power supply voltage Vcc as indicated by "Vcc" in FIG. 13 and the second group of capacitors C21, C22 and C23 receive the ground voltage GND as indicated by "GND" in FIG. 13. The reference width in this case is VRH−VRL=(16/30)Vcc.

At the reference level 1, the capacitors C12, C13, C22 and C23 of the reference voltage generating circuit 420 receive the analog input signal VIP or VIM but the capacitors C11 and C21 are connected to the high impedance $Z_H$ in the sample state, as indicated by "$Z_H$" in FIG. 13. On the other hand, when a transition is made from the sample state to the hold state, the capacitors C11 and C21 which were connected to the high impedance $Z_H$ in the sample state continue to be connected to the high impedance $Z_H$ in the hold state which occurs immediately after this sample state. However, the capacitors C12 and C13 receive the power supply voltage Vcc when the switching elements SW42 and SW43 are switched in response to the control signal from the control part 240 in the hold state. In addition, the capacitors C22 and C23 receive the ground voltage GND when the switching elements SW52 and SW53 are switched in response to the control signal form the control part 240 in the hold state. The reference width in this case is VRH−VRL=(16/28)Vcc.

At the reference level 2, the capacitors C11, C13, C21 and C23 of the reference voltage generating circuit 420 receive the analog input signal VIP or VIM but the capacitors C12 and C22 are connected to the high impedance $Z_H$ in the sample state, as indicated by "$Z_H$" in FIG. 13. On the other hand, when a transition is made from the sample state to the hold state, the capacitors C12 and C22 which were connected to the high impedance $Z_H$ in the sample state continue to be connected to the high impedance $Z_H$ in the hold state which occurs immediately after this sample state. However, the capacitors C11 and C13 receive the power supply voltage Vcc when the switching elements SW41 and SW43 are switched in response to the control signal from the control part 240 in the hold state. In addition, the capacitors C21 and C23 receive the ground voltage GND when the switching elements SW51 and SW53 are switched in response to the control signal form the control part 240 in the hold state. The reference width in this case is VRH−VRL=(16/26)Vcc.

At the reference level 3, the capacitors C13 and C23 of the reference voltage generating circuit 420 receive the analog input signal VIP or VIM but the capacitors C11, C12, C21 and C22 are connected to the high impedance $Z_H$ in the sample state, as indicated by "$Z_H$" in FIG. 13. On the other hand, when a transition is made from the sample state to the hold state, the capacitors C11, C12, C21 and C22 which were connected to the high impedance $Z_H$ in the sample state continue to be connected to the high impedance $Z_H$ in the hold state which occurs immediately after this sample state. However, the capacitor C13 receives the power supply voltage Vcc when the switching element SW43 is switched in response to the control signal from the control part 240 in the hold state. In addition, the capacitor C23 receives the ground voltage GND when the switching element SW53 is switched in response to the control signal form the control part 240 in the hold state. The reference width in this case is VRH−VRL=(16/24)Vcc.

At the reference level 4, the capacitors C11, C12, C21 and C22 of the reference voltage generating circuit 420 receive the analog input signal VIP or VIM but the capacitors C13 and C23 are connected to the high impedance $Z_H$ in the sample state, as indicated by "$Z_H$" in FIG. 13. On the other hand, when a transition is made from the sample state to the hold state, the capacitors C13 and C23 which were connected to the high impedance $Z_H$ in the sample state continue to be connected to the high impedance $Z_H$ in the hold state which occurs immediately after this sample state. However, the capacitors C11 and C12 receive the power supply voltage Vcc when the switching elements SW41 and SW42 are switched in response to the control signal from the control part 240 in the hold state. In addition, the capacitors C21 and C22 receive the ground voltage GND when the switching elements SW51 and SW52 are switched in response to the control signal form the control part 240 in the hold state. The reference width in this case is VRH−VRL=(16/22)Vcc.

At the reference level 5, the capacitors C12 and C22 of the reference voltage generating circuit 420 receive the analog input signal VIP or VIM but the capacitors C11, C13, C21 and C23 are connected to the high impedance $Z_H$ in the sample state, as indicated by "$Z_H$" in FIG. 13. On the other hand, when a transition is made from the sample state to the hold state, the capacitors C11, C13, C21 and C23 which were connected to the high impedance $Z_H$ in the sample state continue to be connected to the high impedance $Z_H$ in the hold state which occurs immediately after this sample state. However, the capacitor C12 receives the power supply voltage Vcc when the switching element SW42 is switched in response to the control signal from the control part 240 in the hold state. In addition, the capacitor C22 receives the ground voltage GND when the switching element SW52 is switched in response to the control signal form the control part 240 in the hold state. The reference width in this case is VRH−VRL=(16/20)Vcc.

At the reference level 6, the capacitors C11 and C21 of the reference voltage generating circuit 420 receive the analog input signal VIP or VIM but the capacitors C12, C13, C22 and C23 are connected to the high impedance $Z_H$ in the sample state, as indicated by "$Z_H$" in FIG. 13. On the other hand, when a transition is made from the sample state to the hold state, the capacitors C12, C13, C22 and C23 which were connected to the high impedance $Z_H$ in the sample state continue to be connected to the high impedance $Z_H$ in the hold state which occurs immediately after this sample state. However, the capacitor C11 receives the power supply voltage Vcc when the switching element SW41 is switched in response to the control signal from the control part 240 in the hold state. In addition, the capacitor C21 receives the ground voltage GND when the switching element SW51 is switched in response to the control signal form the control part 240 in the hold state. The reference width in this case is VRH−VRL=(16/18)Vcc.

At the reference level 7, all of the capacitors C11, C12, C13, C21, C22 and C23 of the reference voltage generating circuit 420 are connected to the high impedance $Z_H$ in the sample state. Further, even when a transition is made from the sample state to the hold state, all of the capacitors C11, C12, C13, C21, C22 and C23 of the reference voltage generating circuit 420 continue to be connected to the high impedance $Z_H$. The reference width in this case is VRH−VRL=(16/16)Vcc=Vcc.

Figure 14:
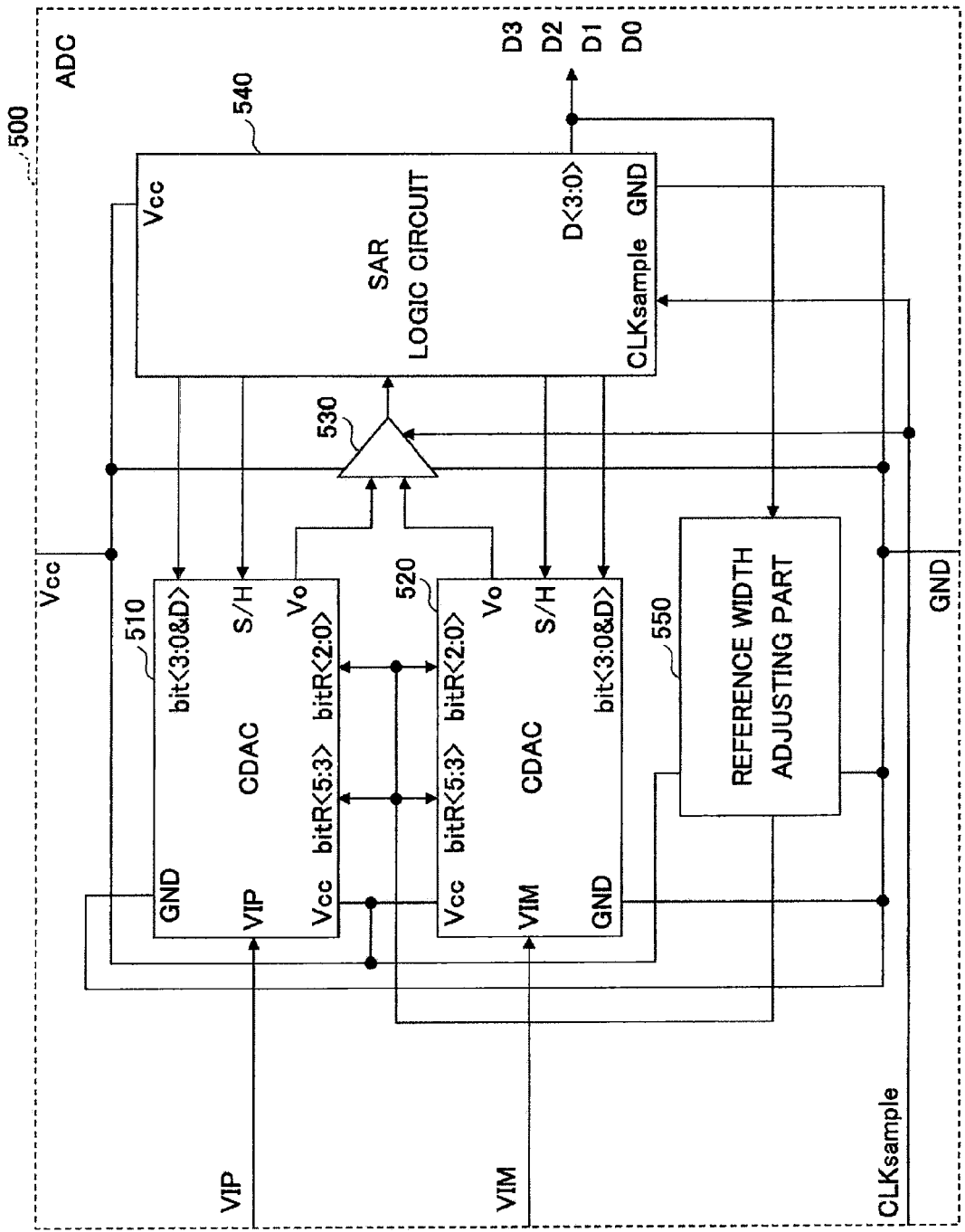
FIG. 14 is a block diagram illustrating the ADC in accordance with the second example of the embodiment further including a reference width adjusting part.

The above described adjustment of the reference width in steps is made based on the digital data signal Vo that is output from the digital code generating circuit 430. FIG. 14 is a block diagram illustrating the ADC 500 in accordance with the second example of the embodiment further including a reference width adjusting part (or circuit) 550.

The ADC 500 illustrated in FIG. 14 includes two CDACs 510 and 520, a comparator 530, a successive approximate register (SAR) logic circuit 540, and the reference width adjusting part 550.

The CDACs 510 and 520 are differential circuits, and may have a circuit structure illustrated in FIGS. 11 and 12, for example.

The comparator 530 compares the digital data signals Vo output from the CDACs 510 and 520, and outputs a binary code "1" or "0".

The SAR logic circuit 540 stores an output signal of the comparator 530 in a 4-bit register thereof, for example. The SAR logic circuit 540 supplies to the CDACs 510 and 520 a sample and hold switching signal S/H that switches the CDACs 510 and 520 between the sample state and the hold state. The SAR logic circuit 540 also supplies a bit output control signal "bit" to the CDACs 510 and 520, in order to switch the switching elements SW31 through SW35 of the digital code generating circuit 430 illustrated in FIG. 9, for example. The CDACs 510 and 520 successively output the digital data signals Vo respectively corresponding to the sampled analog input signals VIP and VIM during the hold time, in response to the bit output control signal "bit". After the hold time ends, the SAR logic circuit 540 outputs a 4-bit digital data stored in the 4-bit register thereof. For example, the 4-bit digital data output from the SAR logic circuit 540 are formed by bits that are all "1"s or all "0"s if the amplitude of the analog input signal VIP or VIM input to the CDACs 510 and 520 exceeds the reference width VRH−VRL. In other words, there are cases where the analog input signal VIP or VIM is not appropriately converted into the digital code by the ADC 500. Accordingly, in such cases where the analog input signal VIP or VIM would not be appropriately converted into the digital code by the ADC 500, the reference width VRH−VRL is adjusted to become the same as the amplitude of the analog input signal VIP or VIM.

The reference width adjusting part 550 monitors the 4-bit digital data output from the SAR logic circuit 540, and adjusts the reference width VRH−VRL depending on the monitored result in order to widen the reference width VRH−VRL. For example, the reference width adjusting part 550 controls the switching of the switching elements SW41, SW42, SW43, SW51, SW52 and SW53 of the reference voltage generating circuit 420 in each of the CDACs 510 and 520 so that the reference width VRH−VRL in an initial state becomes the reference level 0. Thereafter, the reference width adjusting part 550 controls the switching of the switching elements SW41, SW42, SW43, SW51, SW52 and SW53 of the reference voltage generating circuit 420 in each of the CDACs 510 and 520, so that the reference voltage generating circuit 420 increases the reference width VRH−VRL by 1 reference level every time the 4-bit digital data in which the bits are all "1"s or all "0"s is monitored thereby. The reference width adjusting part 550 may store the table illustrated in FIG. 13 in order to control the switching of the reference voltage generating circuit 420 in each of the CDACs 510 and 520 in the manner described above.

For example, at least one of the SAR logic circuit 540 and the reference width adjusting part 550 may be included within the control part 240 illustrated in FIG. 6. In addition, the reference width adjusting part 550 may be included in the CDAC 510 or 520. On the other hand, at least one of the SAR logic circuit 540 and the reference width adjusting part 550 may be provided separately from the control part 240 illustrated in FIG. 6.

Figure 15:
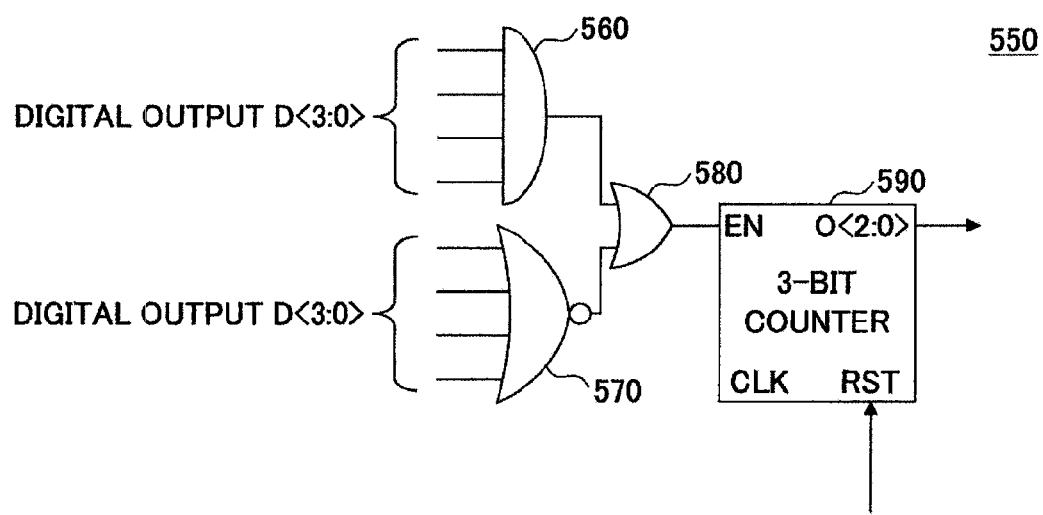
FIG. 15 is a circuit diagram illustrating a circuit part of the reference width adjusting part of FIG. 14.

FIG. 15 is a circuit diagram illustrating a circuit part of the reference width adjusting part 550 of FIG. 14. The circuit part illustrated in FIG. 15 includes a 4-input 1-output AND circuit 560, a 4-input 1-output NOR circuit 570, a 2-input 1-output OR circuit 580, and a counter 590.

The AND circuit 560 outputs a logic signal "1" when the bits of the 4-bit digital data output from the SAR logic circuit 540 are all "1"s, and otherwise outputs a logic signal "0". The NOR circuit 570 outputs a logic signal "1" when the bits of the 4-bit digital data output from the SAR logic circuit 540 are all "0"s, and otherwise outputs a logic signal "0". The logic signals output from the AND circuit 560 and the NOR circuit 570 are input to the OR circuit 580. The OR circuit 580 outputs a logic signal "1" when at least one of the AND circuit 560 and the NOR circuit 570 outputs the logic signal "1". The OR circuit 580 outputs the logic signal "1" when the bits of the 4-bit digital data output from the SAR logic circuit 540 are all "1"s or all "0"s. The logic signal output from the OR circuit 580 is input to the counter 590. The counter 590 is formed by a 3-bit counter capable of counting 8 reference levels of the reference width VRH−VRL from the reference level 0 to the reference level 7. The bits of a counted value of the counter 590 are set to all "0"s in the initial state, and the counted value is incremented by 1 every time the bits of the 4-bit digital data output from the SAR logic circuit 540 are all "1"s or all "0"s.

By using the circuit part having the structure illustrated in FIG. 15, the reference width adjusting part 550 can determine, from the table illustrated in FIG. 13, the connections within the reference voltage generating circuit 420 that achieve reference width VRH−VRL having the reference level corresponding to the counted value of the counter 590. The counter 590 in this example is provided with a reset terminal RST. Hence, when the counted value of the counter 590 reaches the maximum reference level of the reference width VRH−VRL, the bits of the counted value may be reset to all "0"s by inputting a reset signal to the reset terminal RST.

Figure 16:
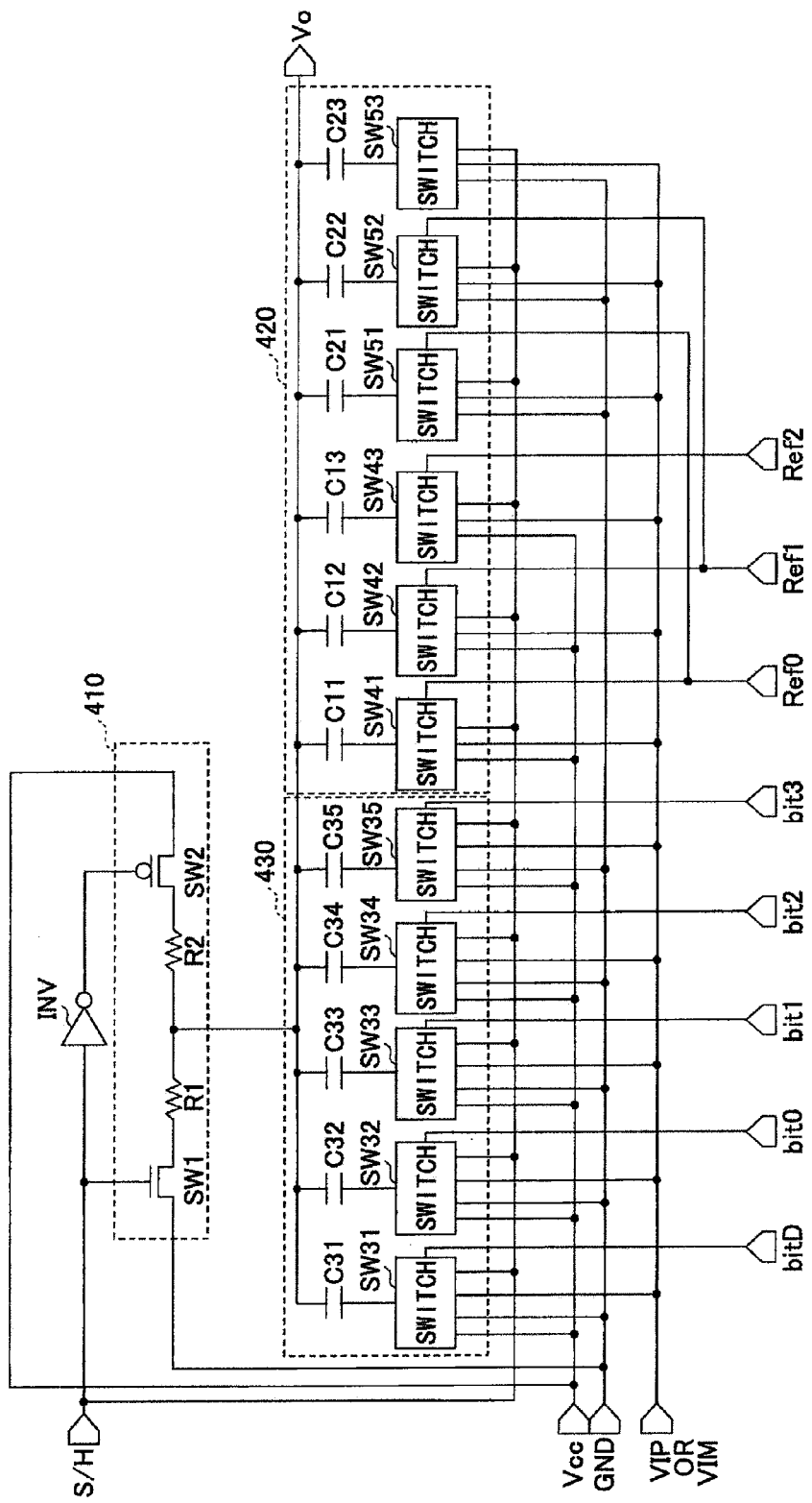
FIG. 16 is a circuit diagram, in more detail, illustrating the CDAC included in the ADC in accordance with the second example of the embodiment.

FIG. 16 is a circuit diagram, in more detail, illustrating the CDAC 200 of FIGS. 11 and 12 included in the ADC 500 in accordance with the second example of this embodiment.

In FIG. 16, the intermediate potential generating part 410 includes the switching elements SW1 and SW2 that are respectively formed by an N-type field effect transistor (FET) and a P-type FET. The sample and hold switching signal S/H supplied from the control part 240 of FIG. 6 is input to a gate of the N-type FET forming the switching element SW1. An inverted signal of the sample and hold switching signal S/H, obtained from an inverter INV, is input to a gate of the P-type FET forming the switching element SW2. For example, the sample and hold switching signal S/H has a high level (or logic level "1") in the sample state, and both the switching elements SW1 and SW2 are ON. Accordingly, a predetermined voltage is generated at the node connecting the resistors R1 and R2, and this predetermined voltage is Vcc/2 if the resistances of the resistors R1 and R2 are the same.

The reference voltage generating circuit 420 includes the switching elements SW41, SW42, SW43, SW51, SW52 and SW53 that are formed by reference voltage generating switch circuits. The switching elements SW41, SW42, SW43, SW51, SW52 and SW53 are switched between the sample state and the hold state by the sample and hold switching signal S/H. The switching elements SW41, SW42, SW43, SW51, SW52 and SW53 may also be switched in response to a reference width changing signal Ref that is supplied from the reference width adjusting part 550 illustrated in FIG. 14, for example, so that the reference width VRH−VRL is changed in steps. In this case, the switching elements SW41 and SW51 may be switched simultaneously in response to a first reference width changing signal Ref0 the switching elements SW42 and SW52 may be switched simultaneously in response to a second reference width changing signal Ref1, and the switching elements SW43 and SW53 may be switched simultaneously in response to a third reference width changing signal Ref2.

Figure 17:
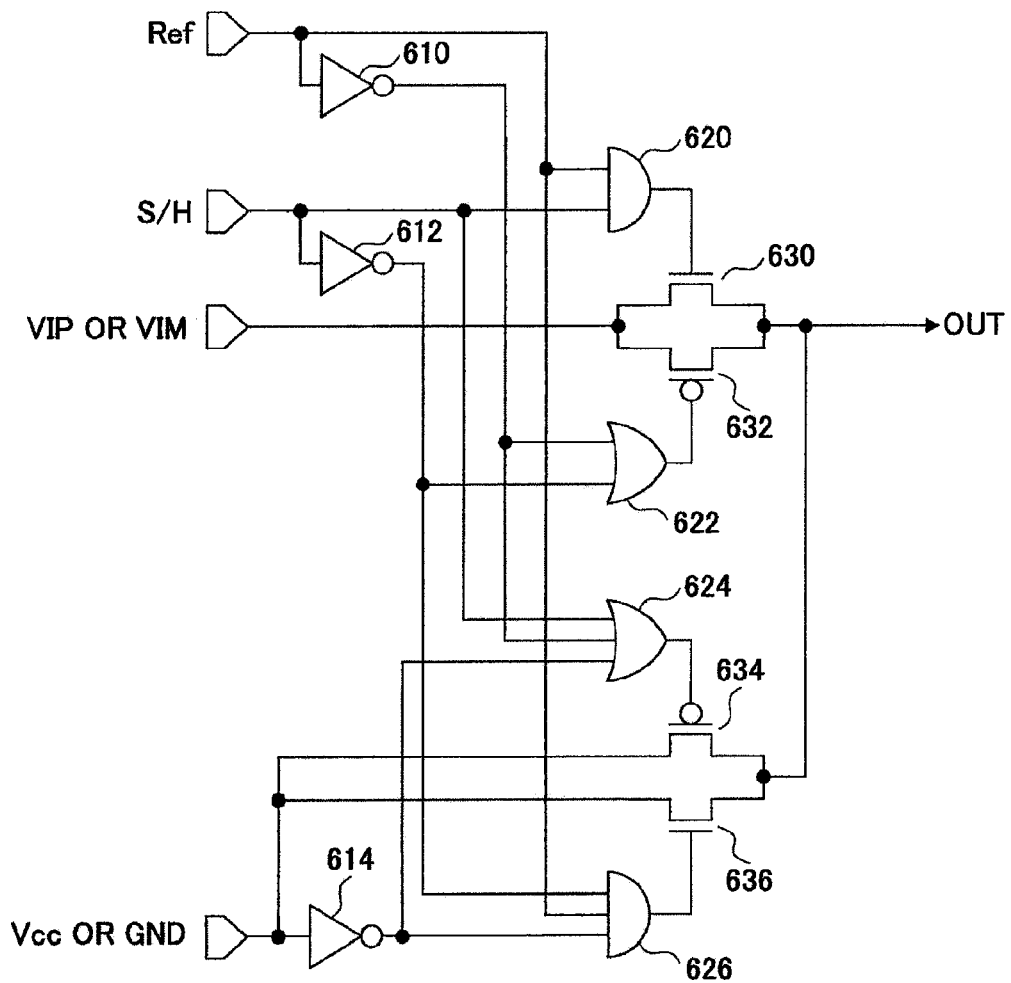
FIG. 17 is a circuit diagram illustrating an example of a reference voltage generating switch circuit of FIG. 16.

FIG. 17 is a circuit diagram illustrating an example of the reference voltage generating switch circuit of FIG. 16 forming each of the switching elements SW41, SW42, SW43, SW51, SW52 and SW53. The reference voltage generating switch circuit includes first through third inverter circuits 610, 612 and 614, first and second AND circuits 620 and 626, first and second OR circuits 622 and 624, and first through fourth FETs 630, 632, 634 and 636.

For example, the first AND circuit 620 is formed by a 2-input 1-output AND circuit that receives the reference width changing signal Ref and the sample and hold switching signal S/H. The first AND circuit 620 outputs a high-level signal when both the reference width changing signal Ref and the sample and hold switching signal S/H have a high level, and otherwise outputs a low-level signal.

For example, the first OR circuit 622 is formed by a 2-input 1-output OR circuit that receives an inverted signal of the reference width changing signal Ref via the first inverter circuit 610 and an inverted signal of the sample and hold switching signal S/H via the second inverter circuit 612. The first OR circuit 622 outputs a low-level signal when both the reference width changing signal Ref and the sample and hold switching signal S/H have a high level, and otherwise outputs a high-level signal.

For example, the second OR circuit 624 is formed by a 3-input 1-output OR circuit that receives the sample and hold switching signal S/H, the inverted signal of the reference width changing signal Ref via the first inverter circuit 610, and an inverted signal of the power supply voltage Vcc or the ground voltage GND via the third inverter circuit 614. In a case where the reference voltage generating switch circuit forms any one of the switching elements SW41, SW42 and SW43 illustrated in FIGS. 11 and 12, for example, the power supply voltage Vcc is input to the third inverter circuit 614, and the second OR circuit 624 outputs a high-level signal unless the reference width changing signal Ref has a high level and the sample and hold switching signal S/H has a low level. On the other hand, in a case where the reference voltage generating switch circuit forms any one of the switching elements SW51, SW52 and SW53 illustrated in FIGS. 11 and 12, for example, the ground voltage GND is input to the third inverter circuit 614, and the second OR circuit 624 outputs a high-level signal.

For example, the second AND circuit 626 is formed by a 3-input 1-output AND circuit that receives the reference width changing signal Ref, the inverted signal of the sample and hold switching signal S/H via the second inverter circuit 612, and the power supply voltage Vcc or the ground voltage GND via the third inverter circuit 614. In the case where the power supply voltage Vcc is input to the third inverter circuit 614 of the reference voltage generating switch circuit, the second AND circuit 626 outputs a low-level signal as long as the power supply voltage Vcc is input thereto. On the other hand, in the case where the ground voltage GND is input to the third inverter circuit 614 of the reference voltage generating switch circuit, the second AND circuit 626 outputs a high-level signal when the reference width changing signal Ref has the high level and the sample and hold switching circuit S/H has the low level, and otherwise outputs a low-level signal.

For example, the first and second FETs 630 and 632 may respectively be formed by an N-type FET and a P-type FET. Drains of the first and second FETs 630 and 632 are connected via a node which receives the analog input signal VIP or VIM. Emitters of the first and second FETs 630 and 632 are connected via an output node which is connected to a corresponding capacitor (not illustrated). A gate of the first FET 630 is connected to the output of the first AND circuit 620, and the first FET 630 is turned ON when the first AND circuit 620 outputs a high-level signal, for example, in order to supply the analog input signal VIP or VIM to the corresponding capacitor. A gate of the second FET 632 is connected to the output of the first OR circuit 622, and the second FET 632 is turned ON when the first OR circuit 622 outputs a low-level signal, for example, in order to supply the analog input signal VIP or VIM to the corresponding capacitor. The analog input signal VIP or VIM is supplied to the corresponding capacitor if both the reference width changing signal Ref and the sample and hold switching signal S/H have a high-level.

For example, the third and fourth FETs 634 and 636 may respectively be formed by a P-type FET and an N-type FET. Drains of the third and fourth FETs 634 and 636 are connected via the node which receives the power supply voltage Vcc or the ground voltage GND. Emitters of the third and fourth FETs 634 and 636 are connected via the output node which is connected to the corresponding capacitor (not illustrated). A gate of the third FET 634 is connected to the output of the second OR circuit 624, and the third FET 634 is turned ON when the second OR circuit 624 outputs a low-level signal, for example, in order to supply the power supply voltage Vcc or the ground voltage GND to the corresponding capacitor. The second OR circuit 624 outputs the low-level signal when the power supply voltage Vcc is input to the third inverter circuit 614 of the reference voltage generating switch circuit. Accordingly, the third FET 634 in the ON state will not supply the ground voltage GND to the corresponding capacitor. A gate of the fourth FET 636 is connected to the output of the second AND circuit 626, and the fourth FET 636 is turned ON when the second AND circuit 626 outputs a high-level signal, for example, in order to supply the power supply voltage Vcc or the ground voltage GND to the corresponding capacitor. The second AND circuit 626 outputs the high-level signal when the ground voltage GND is input to the third inverter circuit 614 of the reference voltage generating switch circuit. Accordingly, the fourth FET 636 in the ON state will not supply the power supply voltage Vcc to the corresponding capacitor.

FIG. 18 is a diagram illustrating a table for explaining the operation of the reference voltage generating switch circuit of FIG. 17. If the reference width changing signal Ref input to the reference voltage generating switch circuit has a low level, the reference voltage generating switch circuit connects the corresponding capacitor to the high impedance $Z_H$, that is, an output "OUT" is connected to the high impedance $Z_H$ as indicated by "$Z_H$". In other words, if the reference width changing signal Ref has the low level, the FETs 630, 632, 634 and 636 within the reference voltage generating switch circuit are turned OFF to put the reference voltage generating switch circuit in the high impedance state. On the other hand, if both the reference width changing signal Ref and the sample and hold switching signal S/H have the high level, the reference voltage generating switch circuit supplies the analog input signal VIP or VIM to the corresponding capacitor as indicated by "ANALOG INPUT". If reference voltage generating switch circuit receives the power supply voltage Vcc, the reference width changing signal Ref has the high level, and the sample and hold switching signal S/H has the low level, the reference voltage generating switch circuit supplies the power supply voltage Vcc to the corresponding capacitor as indicated by "Vcc". Further, if the reference voltage generating switch circuit receives the ground voltage GND, the reference width changing signal Ref has the high level, and the sample and hold switching signal S/H has the low level, the reference voltage generating switch circuit supplies the ground voltage GND to the corresponding capacitor as indicated by "GND".

Returning to the description of FIG. 16, the switching elements SW31, SW32, SW33, SW34 and SW35 of the digital code generating circuit 430 are formed by digital code generating switch circuits. The switching elements SW31, SW32, SW33, SW34 and SW35 are switched between the sample state and the hold state in response to the sample and hold switching signal S/H. The switching elements SW31, SW32, SW33, SW34 and SW35 may be switched in response to the bit output control signal "bit" supplied from the SAR logic circuit 540 illustrated in FIG. 14, for example, in order to successively output the digital code signal Vo during the hold time. The switching of the switching elements SW31, SW32, SW33, SW34 and SW35 is controlled by corresponding bit output control signals "bitD", "bit0", "bit1", "bit2" and "bit3" which are separate signals.

Figure 19:
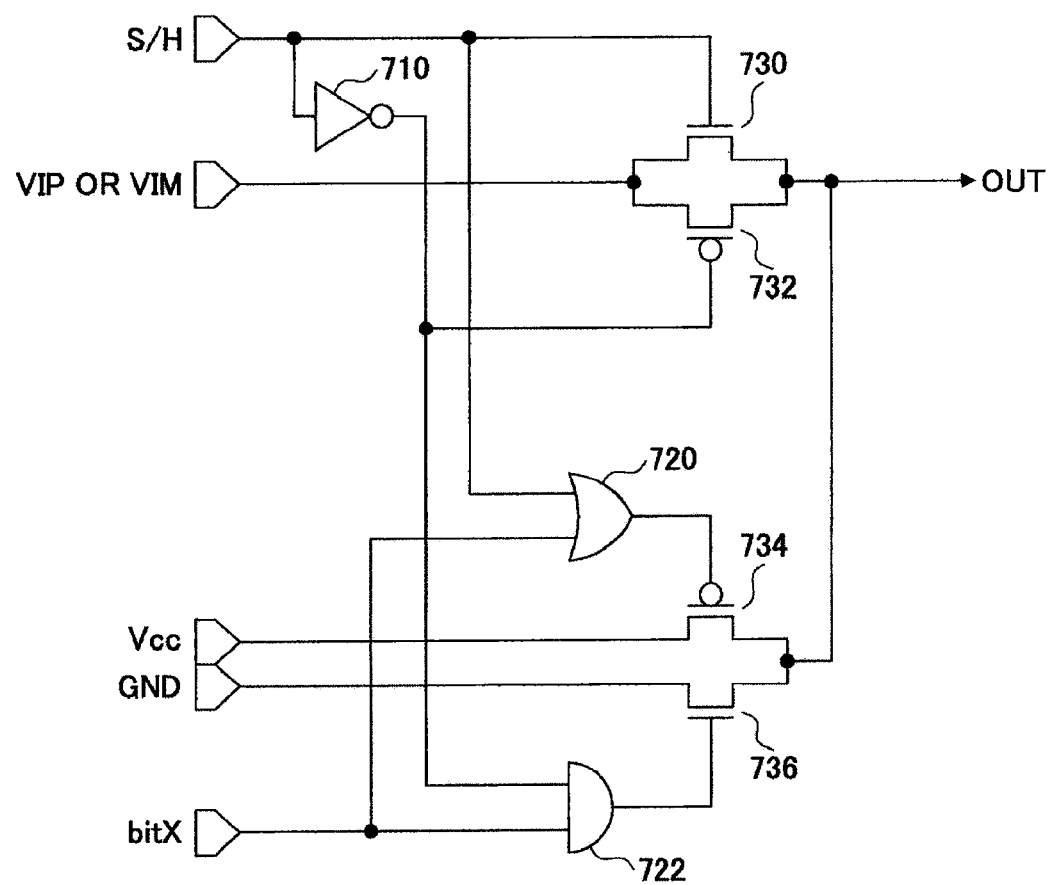
FIG. 19 is a circuit diagram illustrating an example of a digital code generating switch circuit of FIG. 16.

FIG. 19 is a circuit diagram illustrating an example of the digital code generating switch circuit forming the switching elements SW31, SW32, SW33, SW34 and SW35 of FIG. 16. The digital code generating switch circuit includes a NOR circuit 710, an OR circuit 720, and AND circuit 722, and first through fourth FETs 730, 732, 734 and 736.

For example, the AND circuit 722 may be formed by a 2-input 1-output AND circuit that receives an inverted signal of the sample and hold switching signal S/H via the inverter circuit 710 and the corresponding bit output control signal "bitX". The AND circuit 722 outputs a high-level signal if the sample and hold switching signal S/H has the low level and the corresponding bit control signal "bitX" has a high level, and otherwise outputs a low-level signal.

For example, the first and second FETs 730 and 732 may respectively be formed by an N-type FET and a P-type FET. Drains of the first and second FETs 730 and 732 are connected via a node which receives the analog input signal VIP or VIM. Emitters of the first and second FETs 730 and 732 are connected via an output node which is connected to a corresponding capacitor (not illustrated). A gate of the first FET 730 receives the sample and hold switching signal S/H, and the first FET 730 is turned ON when the sample and hold switching signal S/H has the high level in order to supply the analog input signal VIP or VIM to the corresponding capacitor. A gate of the second FET 732 receives the inverted signal of the sample and hold switching signal S/H via the inverter circuit 710, and the second FET 732 is turned ON when the inverted signal of the sample and hold switching signal S/H has the low level in order to supply the analog input signal VIP or VIM to the corresponding capacitor. Hence, the analog input signal VIP or VIM is supplied to the corresponding capacitor when the sample and hold switching signal S/H has the high level.

For example, the third and fourth FETs 734 and 736 may respectively be formed by a P-type FET and an N-type FET. A drain of the third FET 734 receives the power supply voltage Vcc, and a drain of the fourth FET 736 receives the ground voltage GND. Emitters of the third and fourth FETs 734 and 736 are connected via the output node which is connected to the corresponding capacitor. A gate of the third FET 734 receives an output signal of the OR circuit 720, and the third FET 734 is turned ON when the output signal of the OR circuit 720 has a low level in order to supply the power supply voltage Vcc to the corresponding capacitor. A gate of the fourth FET 736 receives an output signal of the AND circuit 722, and the fourth FET 736 is turned ON when the output signal of the AND circuit 722 has a high level in order to supply the ground voltage GND to the corresponding capacitor.

FIG. 20 is a diagram illustrating a table for explaining the operation of the digital code generating switch circuit of FIG. 19. If the sample and hold switching signal S/H input to the digital code generating switch circuit has a high level, the digital code generating switch circuit supplies the analog input signal VIP or VIM to the corresponding capacitor as indicated by "ANALOG INPUT". If the sample and hold switching signal S/H has a low level and the bit output control signal "bitX" has a high level, the digital code generating switch circuit supplies the ground voltage GND to the corresponding capacitor as indicated by "GND". Further, if both the sample and hold switching signal S/H and the bit output control signal "bitX" have a low level, the digital code generating switch circuit supplies the power supply voltage Vcc to the corresponding capacitor as indicated by "Vcc".

Therefore, the ADC in accordance with the embodiment described above internally generates the reference voltages from the power supply voltage Vcc and the ground voltage GND, and adjusts the reference width of the reference voltages.

The first and second examples of the ADC in accordance with the embodiment may be applied to various fields, such as digital communications and medical measurements. The ADC may be formed as a single chip or, may be embedded in an integrated circuit chip having multiple functions.

[Modification]

In the first example in accordance with the embodiment, the reference voltage generating circuit 320 of the CDAC 200 has two capacitor groups, where each capacitor group includes 3 capacitors having a capacitance ratio 1:2:4. More particularly, in the hold state, the capacitors C11, C12 and C13 of the first capacitor group receive the power supply voltage Vcc via the switching elements SW11, SW12 and SW13, and the capacitors C21, C22 and C23 of the second capacitor group receive the ground voltage GND via the switching elements S21, S22 and S23. However, in the hold state, all of the capacitors C11, C12, C13, C21, C22 and C23 within the first and second capacitor groups may receive in common the power supply voltage Vcc or the ground voltage GND. Moreover, the potential received by the capacitors C11, C12, C13, C21, C22 and C23 within the first and second capacitor groups in the hold state is not limited to the power supply voltage or the ground voltage, GND, and the capacitors C11, C12, C13, C21, C22 and C23 within the first and second capacitor groups may receive a predetermined constant voltage, such as a potential generated within the intermediate potential generating circuit 310. In this case, separate switching elements are provided between the intermediate potential generating circuit 310 and the digital code generating circuit 330, instead of providing the switching elements SW1 and SW2 within the intermediate potential generating circuit 310.

In addition, in the second example in accordance with the embodiment, the capacitors C11, C12, C13, C21, C22 and C23 within the reference voltage generating circuit 420 are connected to the high impedance $Z_H$ from the sample state in order to adjust the reference width VRH−VRL, as described above in conjunction with FIG. 13. However, the reference width VRH−VRL may be adjusted in a similar manner by supplying the analog input signal VIP or VIM to the capacitors C11, C12, C13, C21, C22 and C23 within the reference voltage generating circuit 420 in the sample state.

Moreover, the reference voltage generating circuits 320 and 420 may have one or a plurality of capacitors. If the reference voltage generating circuits 320 and 420 have a plurality of capacitors as in the first and second examples in accordance with the embodiment described above, the capacitance ratio of the plurality of capacitors may be set arbitrarily and the capacitance ratio is not limited to the capacitance ratio described above.

Although examples of the embodiment are numbered "first" and "second", for example, the ordinal numbers do not imply priorities of the examples of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A digital-to-analog converter comprising:
an intermediate potential generating circuit configured to generate a voltage from a first power supply voltage and a second power supply voltage;
a reference voltage generating circuit, including one or a plurality of first capacitors coupled in parallel, configured to generate an upper limit reference voltage and a lower limit reference voltage for a reference width which regards the voltage generated in the intermediate potential generating circuit as an intermediate potential;
a digital code generating circuit, including second capacitors coupled in parallel and having a capacitance ratio corresponding to a binary weighting value for representing a digital code, configured to convert a change in an analog input signal with respect to the upper limit reference voltage and the lower limit reference voltage that are generated in the reference voltage generating circuit into the digital code, and to output the digital code; and
a control circuit configured to control the intermediate potential generating circuit, the reference voltage generating circuit and the digital code generating circuit, in order to achieve a sample and hold of the analog input signal, wherein the control circuit controls the reference voltage generating circuit to charge each first capacitor by supplying thereto the analog input signal using the voltage from the intermediate potential generating circuit as a center voltage during a sample time in which the analog input signal is sampled, and to supply a predetermined constant potential to each charged first capacitor during a hold time in which the digital code is output.

2. The digital-to-analog converter as claimed in claim 1, wherein
the reference voltage generating circuit includes a first capacitor group having M first capacitors coupled in parallel, and a second capacitor group having M first capacitors coupled in parallel, where M is a natural number greater than or equal to 2; and
the control circuit controls the reference voltage generating circuit to supply the first power supply voltage to each charged first capacitor of the first capacitor group in the hold state and to supply the second power supply voltage to each charged first capacitor of the second capacitor group in the hold state.

3. The digital-to-analog converter as claimed in claim 1, wherein the control circuit controls the digital code generating circuit to charge each second capacitor by supplying thereto the analog input signal using the voltage from the intermediate potential generating circuit as a center voltage during the sample time, and to supply the first power supply voltage or the second power supply voltage to each charged second capacitor during the hold time.

4. The digital-to-analog converter as claimed in claim 1, wherein each of the first capacitors of the reference voltage generating circuit receives the analog input signal during the sample time.

5. The digital-to-analog converter as claimed in claim 4, further comprising:
a gain adjusting unit configured to control an amplitude of the analog input signal to become equal to the reference width.

6. The digital-to-analog converter as claimed in claim 1, wherein the control circuit controls the reference voltage generating circuit to couple a predetermined number of the first capacitors to a high impedance during the sample time, and continue to couple the predetermined number of the first capacitors to the high impedance during the hold time which occurs immediately after the sample time.

7. The digital-to-analog converter as claimed in claim 6, further comprising:
a reference width adjusting circuit configured to increase, in steps, capacitances of the first capacitors that are coupled to the high impedance every time all bits of the digital code have the same logic level, in order to change the reference width in steps.

8. The digital-to-analog converter as claimed in claim 7, wherein the reference width adjusting circuit comprises:
a table configured to store a correspondence with the reference width that is changed in steps and a connection state of the first capacitors within the reference voltage generating circuit; and
a counter configured to count a number of times all bits of the digital code have the same logic level,
wherein the reference width adjusting circuit reads from the table the connection state of the first capacitors corresponding to the reference width that is indicated by a counted value of the counter.

9. The digital-to-analog converter as claimed in claim 8, wherein:
the reference voltage generating circuit includes reference voltage generating switch circuits configured to switch the connection state of the first capacitors so that the first capacitors receive the analog input signal or the predetermined constant potential or the first capacitors are coupled to the high impedance; and
the reference width adjusting circuit controls switching of the reference voltage generating switch circuits in order to increase capacitances of the first capacitors that are coupled to the high impedance.

10. The digital-to-analog converter as claimed in claim 9, wherein the reference voltage generating switch circuits are switched based on whether a current time is the sample time or the hold time, whether the predetermined constant potential received by the reference voltage generating switch circuits is the first power supply voltage or the second power supply voltage, and a state of a reference width changing signal that instructs changing of the reference width and is output from the reference width adjusting circuit.

11. The digital-to-analog converter as claimed in claim 7, wherein the reference width adjusting circuit is included within the control circuit.

12. The digital-to-analog converter as claimed in claim 1, wherein the digital code generating circuit includes digital code generating switch circuits configured to switch a connection state of the second capacitors so that the second capacitors receive one of the analog input signal, the first power supply voltage and the second power supply voltage.

13. The digital-to-analog converter as claimed in claim 12, wherein the digital code generating switch circuits are switched based on whether a current time is the sample time or the hold time, and a bit output control signal that depends on the digital code that is output.

14. The digital-to-analog converter as claimed in claim 1, wherein a ratio of a difference between the first and second power supply voltages with respect to the reference width is equal to a quotient obtained by dividing a first sum of capacitances of all of the second capacitors by a second sum, where the second sum is sum total of a sum of the capacitances of all of the second capacitors and a sum of the first capacitors that receive the analog input signal during the sample time.

15. The digital-to-analog converter as claimed in claim 1, wherein the control circuit controls the reference voltage generating circuit so that all of the first capacitors receive the analog input signal during the sample time, and at least a portion of the first capacitors are coupled to a high impedance during the hold time that occurs immediately after the sample time without receiving the predetermined constant potential.

16. The digital-to-analog converter as claimed in claim 1, the predetermined constant potential is one of the first power supply voltage, the second power supply voltage, and the intermediate potential.

17. The digital-to-analog converter as claimed in claim 16, wherein the second power supply voltage is a ground voltage.

* * * * *